(12) United States Patent
Oh et al.

(10) Patent No.: US 11,540,387 B2
(45) Date of Patent: Dec. 27, 2022

(54) ELECTRONIC DEVICE INCLUDING FOLDABLE CONDUCTIVE PLATE

(71) Applicant: SAMSUNG ELECTRONICS CO., LTD., Suwon-si (KR)

(72) Inventors: Myeongsu Oh, Suwon-si (KR); Yongyoun Kim, Suwon-si (KR); Hojin Jung, Suwon-si (KR); Duho Chu, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 61 days.

(21) Appl. No.: 17/037,969

(22) Filed: Sep. 30, 2020

(65) Prior Publication Data

US 2021/0105894 A1    Apr. 8, 2021

(30) Foreign Application Priority Data

Oct. 4, 2019  (KR) ........................ 10-2019-0123304

(51) Int. Cl.
*H05K 7/00*      (2006.01)
*H05K 1/02*      (2006.01)
(Continued)

(52) U.S. Cl.
CPC ..... *H05K 1/0281* (2013.01); *G02F 1/133305* (2013.01); *G02F 1/133308* (2013.01);
(Continued)

(58) Field of Classification Search
CPC .... H05K 1/0281; H05K 1/118; H05K 5/0017; G02F 1/133305; G02F 1/133308; G06F 1/1681
(Continued)

(56) References Cited

U.S. PATENT DOCUMENTS 6,411,353 B1    6/2002  Yarita et al.
2004/0257515 A1  12/2004  Lee
(Continued)

FOREIGN PATENT DOCUMENTS

JP    2004-213021    7/2004
KR    10-0998639    12/2010
(Continued)

OTHER PUBLICATIONS

International Search Report and Written Opinion dated Jan. 8, 2021 in corresponding International Application No. PCT/KR2020/013217.
(Continued)

*Primary Examiner* — Andargie M Aychillhum
(74) *Attorney, Agent, or Firm* — Nixon & Vanderhye P.C.

(57) ABSTRACT

Various embodiments relate to an electronic device including a foldable conducive plate. The electronic device may include: a foldable housing at least partially foldable via a hinge; a display including a flexible display panel viewable through a front surface of the foldable housing and being at least partially foldable, and a conductive plate disposed on a rear surface of the flexible display panel and supporting the flexible display panel; a circuit board disposed to face at least a portion of a border of the conductive plate in the foldable housing; and at least one conductive connection member comprising a conductor disposed between the conductive plate and the circuit board and electrically connecting the conductive plate and a ground of the circuit board.

20 Claims, 17 Drawing Sheets

(51) Int. Cl.
    *G02F 1/1333*     (2006.01)
    *H05K 5/00*     (2006.01)
    *G06F 1/16*     (2006.01)
    *H05K 1/11*     (2006.01)

(52) U.S. Cl.
    CPC .......... *G06F 1/1681* (2013.01); *H05K 1/118* (2013.01); *H05K 5/0017* (2013.01)

(58) Field of Classification Search
    USPC ........................................................ 361/749
    See application file for complete search history.

(56) References Cited

U.S. PATENT DOCUMENTS

| | | | | |
|---|---|---|---|---|
| 2005/0237275 | A1* | 10/2005 | Inoue | G09G 3/2965 345/60 |
| 2011/0121714 | A1 | 5/2011 | Kim et al. | |
| 2017/0033442 | A1* | 2/2017 | Choi | G06F 3/044 |
| 2017/0142241 | A1* | 5/2017 | Kim | H04M 1/0218 |
| 2017/0249040 | A1 | 8/2017 | Kim et al. | |
| 2018/0166809 | A1 | 6/2018 | Brogan et al. | |
| 2018/0219628 | A1* | 8/2018 | Makurin | H01Q 21/20 |
| 2018/0366813 | A1 | 12/2018 | Kim et al. | |
| 2019/0146556 | A1 | 5/2019 | Mizoguchi et al. | |
| 2020/0267838 | A1 | 8/2020 | An et al. | |
| 2021/0218129 | A1 | 7/2021 | Kim et al. | |

FOREIGN PATENT DOCUMENTS

| | | |
|---|---|---|
| KR | 10-2011-0057675 | 6/2011 |
| WO | WO 2016/198559 A1 | 12/2016 |

OTHER PUBLICATIONS

Extended European Search Report dated Sep. 1, 2022 for EP Application 20873290.9.

* cited by examiner

ELECTRONIC DEVICE INCLUDING FOLDABLE CONDUCTIVE PLATE

CROSS-REFERENCE TO RELATED APPLICATION

This application is based on and claims priority under 35 U.S.C. § 119 to Korean Patent Application No. 10-2019-0123304, filed on Oct. 4, 2019, in the Korean Intellectual Property Office, the disclosure of which is incorporated by reference herein in its entirety.

BACKGROUND

Field

The disclosure relates to an electronic device including a foldable conductive plate.

Description of Related Art

Electronic devices have conventionally had a standardized oblong shape, but are being changed into various shapes. For example, electronic devices may have a transformable structure that can be conveniently carried and can provide a large display screen when used. Foldable type electronic devices are released as a kind of electronic device.

In general, a foldable electronic device includes a flexible display and a conductive plate is disposed on the rear surface of the flexible display. The conductive plate serves to increase rigidity by supporting the display and may be grounded to the ground of a printed circuit board through an electrical connection member to prevent (e.g., greenish or reddish) burn-in of the display and block noise.

According to such a foldable electronic device of the related art, when the conductive plate and the ground are grounded inside the border of the flexible display, the surface of the flexible display may protrude at the corresponding portion, so the surface quality may be deteriorated.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide an electronic device having the ability to prevent and/or reduce (e.g., greenish or reddish) burn-in of a display and to block and/or reduce noise can be improved by grounding a conductive plate and a ground through at least a portion of the border of a flexible display.

An electronic device according to various example embodiments may include: a foldable housing at least partially foldable via a hinge; a display including a flexible display panel viewable through a front surface of the foldable housing and being at least partially foldable, and a conductive plate disposed on a rear surface of the flexible display panel supporting the flexible display panel; a circuit board disposed to face at least a portion of a border of the conductive plate in the foldable housing; and at least one conductive connection member comprising a conductor disposed between the conductive plate and the circuit board and configured to electrically connect the conductive plate and a ground of the circuit board.

An electronic device according to various example embodiments may include: a housing having a side bezel surrounding at least a portion of an edge of the electronic device; a display including a flexible display panel and a conductive plate disposed on a rear surface of the flexible display panel, the conductive plate supporting the flexible display panel; a circuit board disposed to face at least a portion of a border of the conductive plate inside the side bezel and including a ground; and at least one connective connection member comprising a conductor disposed between the conductive plate and the circuit board and electrically connecting the conductive plate and the ground of the circuit board.

In an electronic device according to various embodiments, it is possible to prevent and/or reduce (e.g., greenish or reddish) burn-in of a display and to block and/or reduce noise by grounding a conductive plate and a ground through at least a portion of an edge of a flexible display.

In an electronic device according to various embodiments, it is possible to prevent and/or reduce surface quality deterioration in which a surface of a flexible display may protrude due to the grounding structure of a ground by grounding a conductive plate and a ground through at least a portion of the edge of a flexible display.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
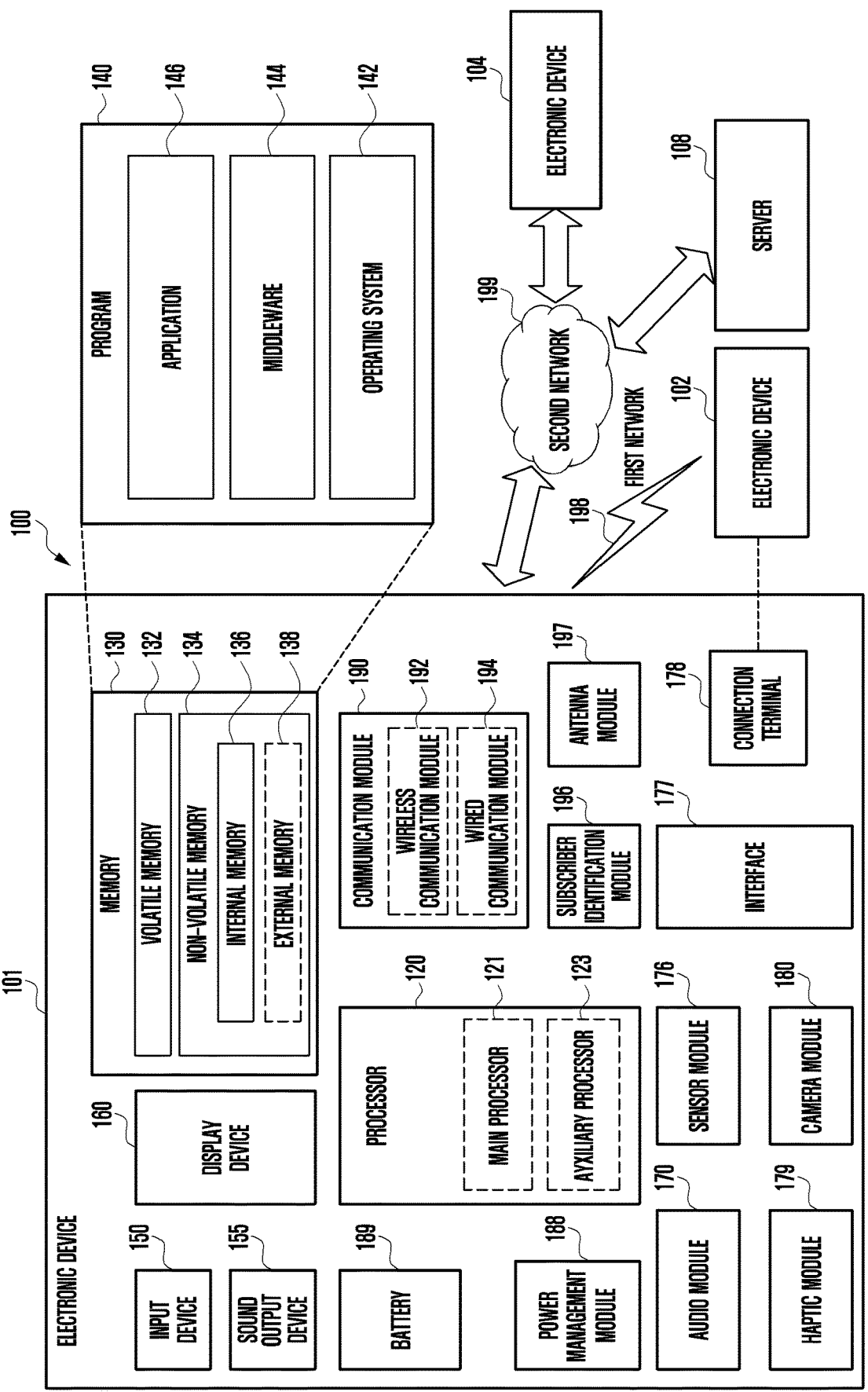
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
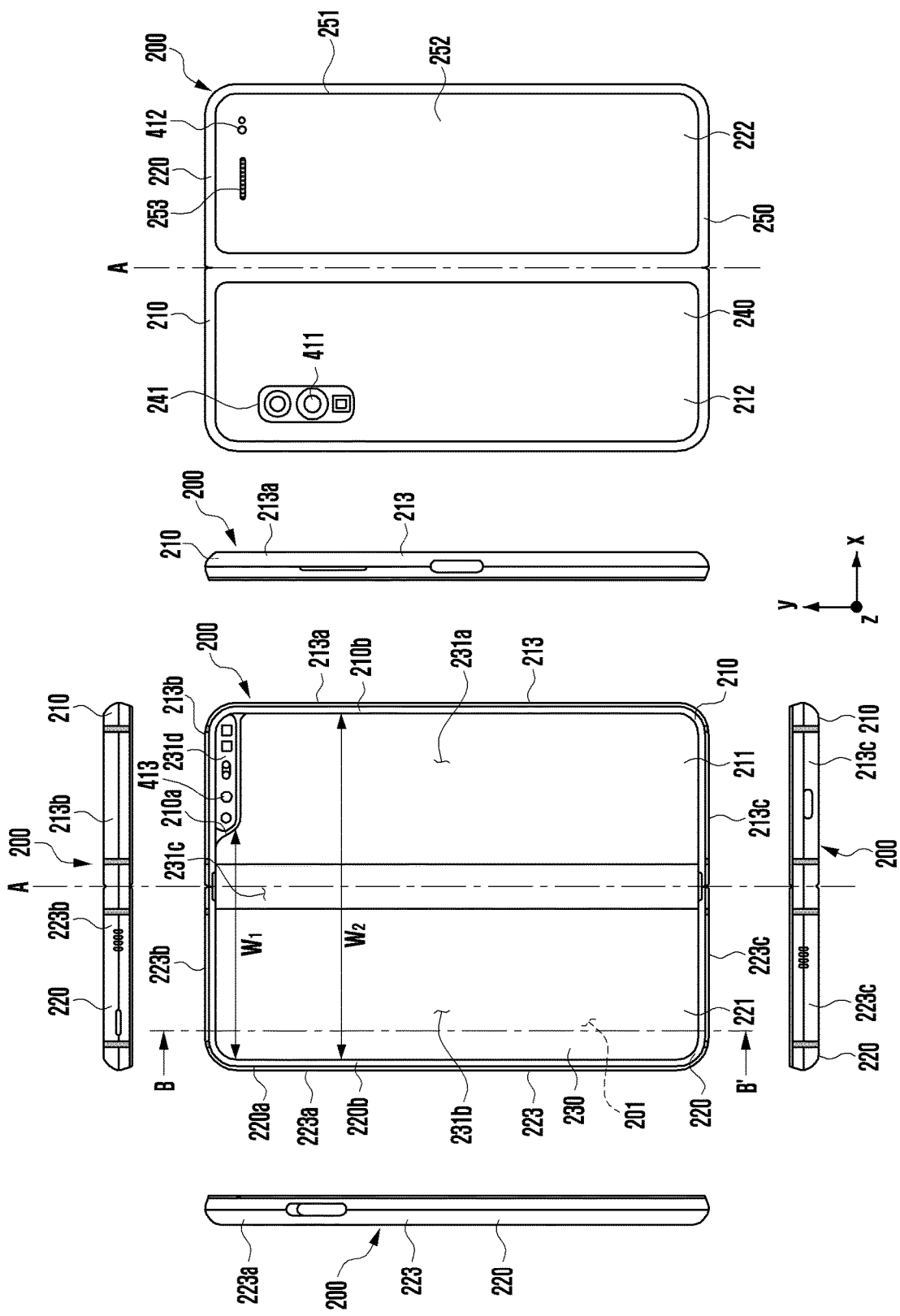
FIG. 2A is a diagram illustrating an example unfolded state of an electronic device according to various embodiments.
Figure 2B:
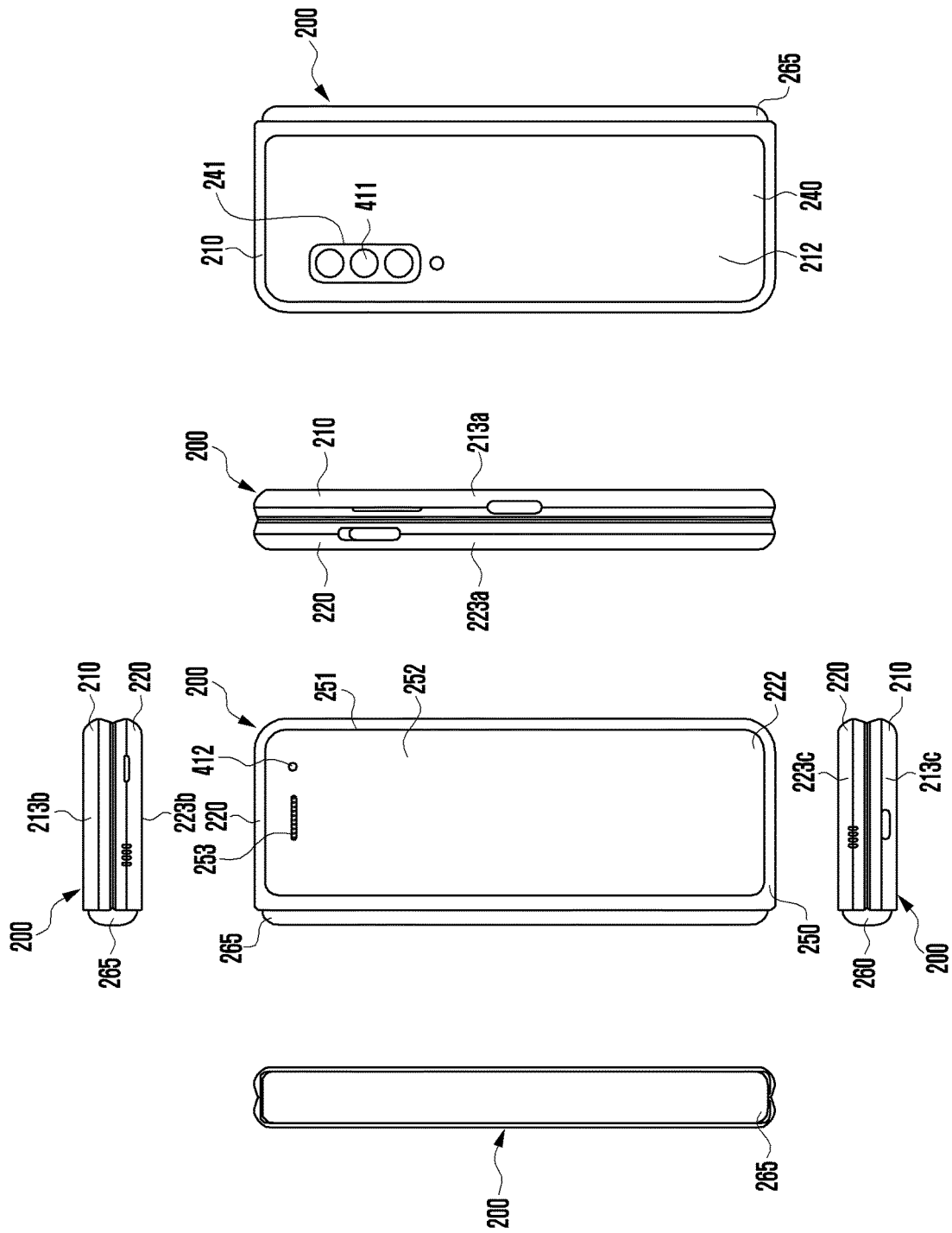
FIG. 2B is a is a diagram illustrating an example folded state of the electronic device according to various embodiments shown in FIG. 2A.

FIG. 2A is a diagram illustrating an example electronic device in an example unfolded state according to various embodiments. FIG. 2B is a diagram illustrating the electronic device of FIG. 2A in an example folded state according to various embodiments;

Referring to FIG. 2A, an electronic device 200 (e.g., the electronic device 101 of FIG. 1) may include a first housing 210 and a second housing 220 including at least one space, in which at least one display may be disposed, at least one display 230 (e.g., a flexible display, a foldable display, or a first display) disposed in the at least one space, a second display (e.g., a sub-display) disposed on one surface of the second housing 220, a hinge (e.g., a hinge 264 of FIG. 3) configured such that the first housing 210 and the second housing 220 are folded with respect to each other, and a hinge cover (e.g., a hinge cover 265 of FIG. 3) that covers foldable portions of the first housing 210 and the second housing 220. In the disclosure, a surface on which first the display 230 is disposed may be defined as a front surface of the electronic device 200, and an opposite surface of the front surface may be defined as a rear surface of the electronic device 200. A surface that surrounds a space between the front surface and the rear surface may be defined as a side surface of the electronic device 200.

In an embodiment, the pair of housings 210 and 220 may include a first housing 210 including a sensor area 231d, a second housing 220, a first rear cover 240, and a second rear cover 250. The pair of housings 210 and 220 of the electronic device 200 are not limited to the shape and coupling state illustrated in FIGS. 2A and 2B, and may be realized through another shape or another combination and/or coupling of components. For example, in another embodiment, the first housing 210 and the first rear cover 240 may be integrally formed, and the second housing 220 and the second rear cover 250 may be integrally formed.

According to an embodiment, the first housing 210 and the second housing 220 may be one housing (not illustrated), and a folded portion of the one housing may be formed of a flexible material (not illustrated), and the hinge 264 may be replaced by a flexible material without being configured separately. According to an embodiment, the first housing 210 and the second housing 220 may be disposed on opposite sides of a folding axis (axis A), and may be folded or unfolded about the folding axis (axis A). According to an embodiment, the angle or the distance between the first housing 210 and the second housing 220 may vary according to whether the state of the electronic device 200 is an unfolded state (a flat state or a closed state), a folded state, or an intermediate state. At least a partial area of the first housing 210 or the second housing 220 may include a sensor area 231d, in which various sensors are disposed. In another embodiment, a sensor arrangement area 231d may be additionally disposed in at least a partial area of the second housing 220 or may be replaced. According to an embodiment, an angle defined by the first housing 210 and the second housing 220 may be adjusted by the hinge (e.g., the hinge 264 of FIG. 3). According to an embodiment, the electronic device 200 may be said to be in a fully unfolded state when the first housing 210 and the second housing 220 face the same surface (e.g., the front surface) or are in parallel to the same axis (the X axis). According to an embodiment, in the electronic device 200, the first display 230 may be disposed in the space defined by the first housing 210 and the second housing 220, the first display 230 may include a first surface 211 and a third surface 221, and a flexible area that may be bent at a specific angle may be formed between the first surface 211 and the third surface 221. According to an embodiment, in addition to the first surface 211 and the third surface 211, an area that may be bent in various forms may be present in the first display 230, at least a portion of which may be bent, and the number of the areas that may be bent is not limited to one. According to various embodiments, the hinge (e.g., 264 of FIG. 3) may be disposed in an area of the display 230, which may be bent, and when the first display 230 is bent, the first display 230 may be supported such that the first display 230 maintains a predetermined angle while being bent. According to an embodiment, the first housing 210 may include a first surface 211 disposed to face the front surface, a second surface 212 that faces a direction that is opposite to the first surface 211, and a first side member (e.g., bezel) 213 that surrounds at least a portion of the space between the first surface 211 and the second surface 212. In an embodiment, the first side member 213 may include a first side surface 213a disposed parallel to the folding axis (axis A), a second side surface 213b that extends from one end of the first side surface 213a in a direction that is perpendicular to the folding axis, and a third side surface 213c that extends from an opposite end of the first side surface 213a in a direction that is perpendicular to the folding axis (axis A).

In an embodiment, the second housing 220 may include a third surface 221 connected to the hinge (e.g., the hinge 264 of FIG. 3) and disposed to face the front surface of the electronic device 200, a fourth surface 222 that faces an opposite direction of the third surface 221, and a second side surface 220 that surrounds at least a portion of a space between the third surface 221 and the fourth surface 222. In an embodiment, the second side member 220 may include a fourth side surface 223a disposed parallel to the folding axis (axis A), a fifth side surface 223b that extends from one end of the fourth side surface 223a in a direction that is perpendicular to the folding axis, and a sixth side surface 223c that extends from an opposite end of the fourth side surface 223a in a direction that is perpendicular to the folding axis (axis A). In an embodiment, the third surface 221 may face the first surface 211 in the folded state.

In an embodiment, the electronic device 200 may include a recess 201 configured to accommodate the first display 230, at least a portion of which may be bent, through structural shape coupling of the first housing 210 and the second housing 220. According to an embodiment, the recess 201 may have a size that is substantially the same as that of the display 230. In an embodiment, due to the sensor area 231d, the recess 201 may have two different widths in a direction that is perpendicular to the folding axis (axis A). For example, the recess 201 may have a first width W1 between a first portion 220a of the second housing 220 and a first portion 210a disposed at a periphery of the sensor area 231d of the first housing 210, and may have a second width W2 by the second portion 220b of the second housing 210 and a second portion 210b of the first housing 210, which does not correspond to the sensor area 213d and is parallel to the folding axis (the axis A). According to various embodiments, the width of the recess 201 may not be limited to the illustrated example. According to various embodiments, the recess 201 may have two or more different widths, and may have the same width.

In an embodiment, at least a portion of the first housing 210 and the second housing 220 may be formed of a metallic material or a nonmetallic material having a selected strength to support the display 230.

In an embodiment, the sensor area 231d may be disposed to have a predetermined area at a location that is adjacent to one corner of the first housing 210. However, the arrangement, shape, or size of the sensor area 231d may not be limited thereto. According to various embodiments, at least one of a front camera device, a receiver, a proximity sensor, an ultrasonic wave sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an indicator may be disposed at at least a partial area of the sensor area 231d. According to various embodiments, the components may be disposed in the interior of the electronic device while there is provided no separate sensor area. For example, at least some of the components may be disposed under the first display 230 or may be exposed through a partial area of the first display 230.

In an embodiment, the first rear cover 240 may be disposed on the second surface 212 of the first housing 210, and may have a substantially rectangular periphery. In an embodiment, at least a portion of the periphery may be surrounded by the first housing 210. Similarly, the second rear cover 250 may be disposed on the fourth surface 222 of the second housing 220, and at least a portion of the periphery may be surrounded by the second housing 220.

In the illustrated embodiment, the first rear cover 240 and the second rear cover 250 may have shapes that are substantially symmetrical to each other with respect to the folding axis (axis A). In another embodiment, the first rear cover 240 and the second rear cover 250 may include various different shapes. In another embodiment, the first rear cover 240 may be integrally formed with the first housing 210, and the second rear cover 250 may be integrally formed with the second housing 220.

In an embodiment, the first rear cover 240, the second rear cover 250, the first housing 210, and the second housing 220 may provide spaces, in which various components (e.g., a printed circuit board, an antenna module, a sensor module, or a battery) of the electronic device 200 may be disposed, through coupling structures thereof. In an embodiment, one or more components may be disposed on the rear surface of the electronic device or may be visually exposed. For example, one or more components or sensors may be visually exposed while there is provided no separate sensor area. In various embodiments, the sensor may include a proximity sensor, a rear camera, and/or a flash. In another embodiment, at least a portion of the sub-display 252 (e.g., the second display) may be visually exposed through the second rear area 251 of the second rear cover 250. In another embodiment, the electronic device 200 may include a speaker module 253 disposed through at least a partial area of the second rear cover 250.

The first display 230 may be disposed in the space defined by the first and second housings 210 and 220. For example, the first display 230 may be seated in the recess 201 defined by the first and second housings 210 and 220, and may be disposed to occupy substantially most of the front area of the electronic device 200. Accordingly, the front surface of the electronic device 200 may include a first display 230, and a partial area (e.g., a peripheral area) of the first housing 210 and a partial area (e.g., a peripheral area) of the second housing 220, which are adjacent to the first display 230. In an embodiment, the rear surface of the electronic device 200 may include the first rear cover 240, and a partial area (e.g., a peripheral area) of the first housing 210, which is adjacent to the first rear cover 240, the second rear cover 250, and a partial area (e.g., a peripheral area) of the second housing 220, which is adjacent to the second rear cover 250.

In an embodiment, the first display 230 may refer to a display, at least a partial area of which may be deformed to a flat surface or a curved surface. In an embodiment, the first display 230 may include a folding area 231c, a first area 231a disposed on one side (e.g., the right area with respect to the folding area 231c) of the folding area 231c, and a second area 231b disposed on an opposite side (the left area with respect to the folding area 231c) of the folding area 231c. For example, the first area 231a may be disposed on the first surface 211 of the first housing 210, and the second area 231b may be disposed on the third surface 221 of the second housing 220. In an embodiment, the classification of the areas of the first display 230 is illustrative, and the first display 230 may be classified into a plurality of areas (e.g., four or more or two) according to the structure or function of the first display 230. As an example, although the areas of the first display 230 are classified by the folding area 231c or the folding axis (axis A) extending in parallel to the y axis in the embodiment illustrated in FIG. 2A, the areas of the first display 230 may be classified with reference to another folding area (e.g., a folding area that is parallel to the x axis) or another folding axis (e.g., a folding axis that is parallel to the x axis) in another embodiment. One entire screen of the display 230 may be displayed through the pair of housings 210 and 220 and the hinge (e.g., simply a physical classification by the hinge (e.g., the hinge 264 of FIG. 3), and substantially the pair of housings 210 and 220 and the hinge (e.g., the hinge 264 of FIG. 3) using the above-described classification of the areas of the display. In an embodiment, the first area 231a, unlike the second area 231b, may include a notch area (e.g., the notch area 233 of FIG. 3) that is cut according to presence of the sensor area 231d. In an embodiment, the first area 231a and the second area 231b may include parts having symmetrical shapes, and parts having asymmetrical shapes.

Figure 3:
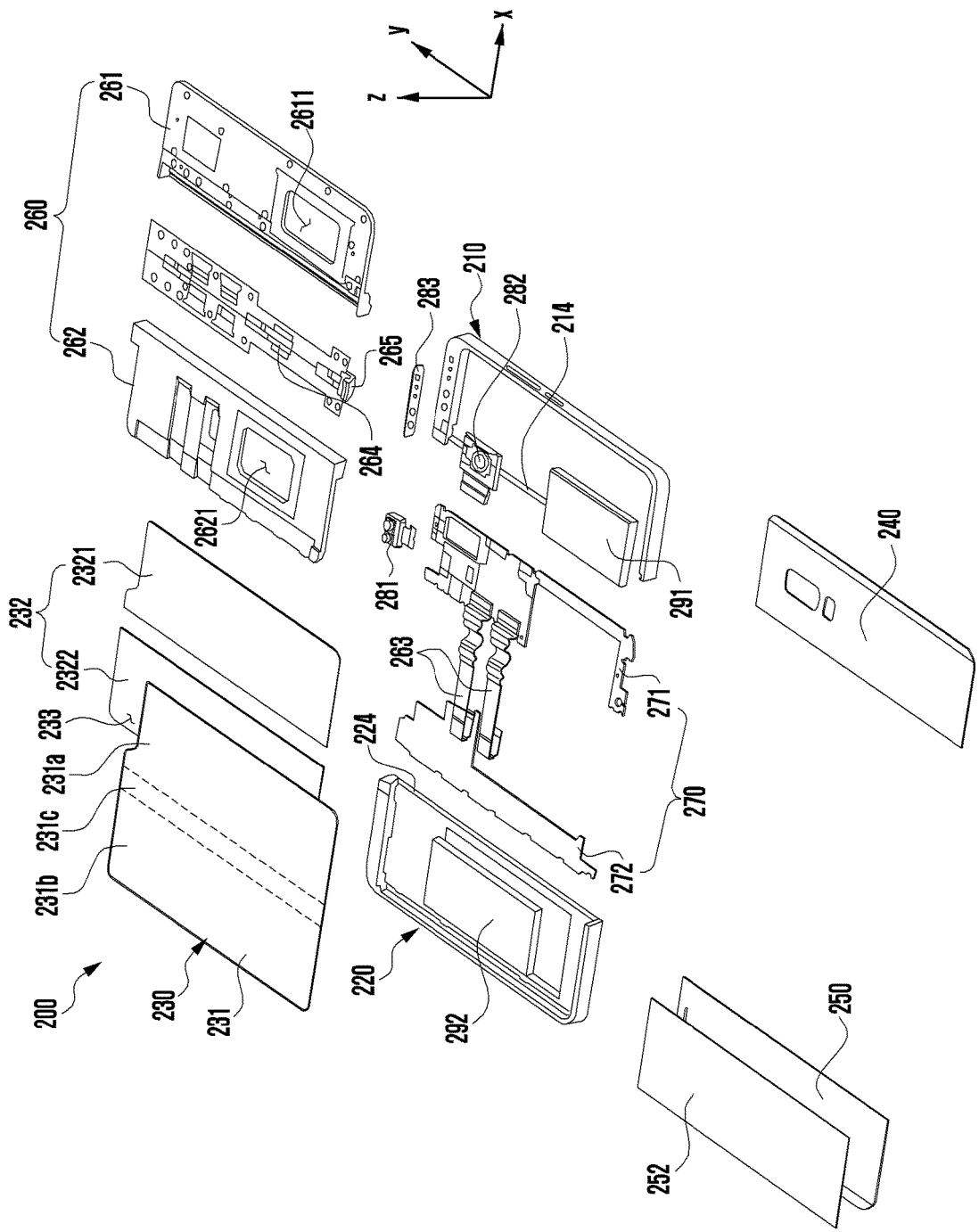
FIG. 3 is an exploded perspective view illustrating the example electronic device according to various embodiments.

Referring to FIG. 2B, the hinge cover 265 is disposed between the first housing 210 and the second housing 220, and may be configured to cover an internal component (e.g., the hinge 264 of FIG. 3). In an embodiment, the hinge cover 265 may be covered by a portion of the first housing 210 and the second housing 220 or may be exposed to the outside according to the operational state (the unfolded state (flat state or the first specific state) or the folded state or the second specific state) of the electronic device 200.

Hereinafter, the operations of the first housing 210 and the second housing 220 according to the operational states (e.g., the unfolded state (flat state) and the folded state) of the electronic device 200, and the areas of the first display 230 will be described.

According to an embodiment, when the electronic device 200 is in an unfolded state (flat state) (e.g., the state of FIG. 5A), the first housing 210 and the second housing 220 may define a horizontal angle (e.g., 180 degrees). In the unfolded state (e.g., the first specific state), the first area (e.g., 231a of FIG. 2A) and the second area (e.g., 231b of FIG. 2a) of the display may be disposed to face the same direction. Further, when the electronic device is in the unfolded state, the folding area (e.g., 231c of FIG. 2A) may define a plane that is the same as the first area 231a and the second area 231b. As another embodiment, when the electronic device 200 is in the unfolded state (flat state), the first housing 210 and the second housing 220, for example, may be folded in opposite directions such that the second surface 212 and the fourth surface 222 face each other as the second housing 220 rotates such that the angle of the second housing 220 with respect to the first housing 210 becomes 360 degrees.

In an embodiment, when the electronic device 200 is in an intermediate state (e.g., the state of FIG. 5B or the second specific state), the first housing 210 and the second housing 220 may be disposed to define a certain angle (e.g., between 10 degrees to 90 degrees). The first area (e.g., 231a of FIG. 2A) and the second area (e.g., 231b of FIG. 2A) of the first display 230 may define an angle that is larger in the folded state and is smaller in the unfolded state. At least a portion of the folding area (e.g., 231c of FIG. 2A) may be a curved surface having a predetermined curvature, and the curvature then may be smaller than in the folded state.

In an embodiment, when the electronic device 200 is in the folded state (e.g., the state of FIG. 5C or the third specific state), the first housing 210 and the second housing 220 may be disposed to face each other. The first area (e.g., 231a of FIG. 2A) and the second area (e.g., 231b of FIG. 2A) of the first display 230 may be disposed to face each other while the angle defined by them is maintained at an acute angle. At least a portion of the folding area (e.g., 231c of FIG. 2A) may be a curved surface having a predetermined curvature.

FIG. 3 is an exploded perspective view illustrating an example electronic device 200 according to various embodiments.

Referring to FIG. 3, in an embodiment, the electronic device 200 may include a first housing 210, a second housing 220, a first display 230, a first rear cover 240, a second rear cover 250, a support member assembly 260, and at least one printed circuit board 270. In the disclosure, the first display 230 (e.g., the main display) may be referred, for example, to a display module or a display assembly.

The first display 230 may include a display panel 231 (e.g., a flexible display panel), and one or more plates 232 or layers, on which the display panel 231 is seated. In an embodiment, the plate 232 may be disposed between the display panel 231 and the support member assembly 260. A display panel 231 may be disposed at at least a portion of one surface of the plate 232. The plate 232 may include a first plate 2321 and a second plate 2322 that are divided with reference to the hinge 264. The plate 232 may include at least one subsidiary material layer (e.g., a graphite member) disposed on a rear surface of the display panel 231, and/or a conductive plate (e.g., a cu sheet). In an embodiment, the plate 232 may have a shape corresponding to the display panel 231. For example, a partial area of the first plate 2321 may have a shape corresponding to the notch area 233 of the display panel 231.

The support member assembly 260 may include a first support member 261 (e.g., a first support plate), a second support member 262 (e.g., a second support plate), a hinge 264 disposed between the first support member 261 and the second support member 262, a hinge cover 265 that covers the hinge 264 when the hinge 264 is viewed from the outside, and at least one wiring member (e.g., a flexible printed circuit board (FPCB)) that crosses the first support member 261 and the second support member 262.

In an embodiment, the support member assembly 260 may be disposed between the plate 232 and the at least one printed circuit board 270. As an example, the first support member 261 may be disposed between the first area 231a of the first display 230 and the first printed circuit board 271. The second support member 262 may be disposed between the second area 231b of the first display 230 and the second printed circuit board 272.

In an embodiment, at least a portion of the wiring member 263 and the hinge 264 may be disposed in the interior of the support member assembly 260. The wiring member 263 may be disposed in a direction (e.g., the x axis direction) that crosses the first support member 261 and the second support member 262. The wiring member 263 may be disposed in a direction (e.g., the x axis direction) that is perpendicular to the folding axis (e.g., the y axis or the folding axis A of FIG. 2A) of the folding area 231c.

In an embodiment, the at least one printed circuit board 270, as mentioned above, may include a first printed circuit board 271 disposed on the first support member 261, and a second printed circuit board 272 disposed on the second support member 262. The first printed circuit board 271 and the second printed circuit board 272 may be disposed in the interior of the space defined by the support member assembly 260, the first housing 210, the second housing 220, the first rear cover 240, and the second rear cover 250. Components for realizing various functions of the electronic device 200 may be mounted on the first printed circuit board 271 and the second printed circuit board 272.

In an embodiment, a first printed circuit board 271 disposed in the space defined through the first support member 261, a first battery 291 disposed at a location that faces a first swelling hole 2611 of the first support member 261, at least one sensor module 281, or at least one camera module 282 may be included in the first space of the first housing 210. The first housing 210 may include a window glass 283 disposed to protect at least one sensor module 281 and at least one camera module 282 at a location corresponding to a notch area 233 of the first display 230. In an embodiment, a second printed circuit board 272 disposed in the second space defined through the second support member 262 and a second battery 292 disposed at a location that faces a second swelling hole 2621 of the second support member 262 may be included in the second space of the second housing 220. In an embodiment, the first housing 210 and the first support member 261 may be integrally formed. In an embodiment, the second housing 220 and the second support member 262 also may be integrally formed. According to an embodiment, a second display 252 may be disposed in the second space of the second housing 220. According to an embodiment, the second display 252 may be disposed to be viewed from the outside through at least a partial area of the second rear cover 250. According to various embodiments, the second display 252 may be disposed to occupy substantially most of the fourth surface 222 of the second housing 220. For example, a partial area (e.g., a peripheral area) of the second display 252 and the second rear cover 250 that is adjacent to the second display 252 may be exposed through the fourth surface 222 of the second housing 220.

In an embodiment, the first housing 210 may include a first rotation support surface 214, and the second housing 220 may include a second rotation support surface 224 corresponding to the first rotation support surface 214. The first rotation support surface 214 and the second rotation support surface 224 may include curved surfaces corresponding to the curved surface included in the hinge cover 265.

Figure 4:
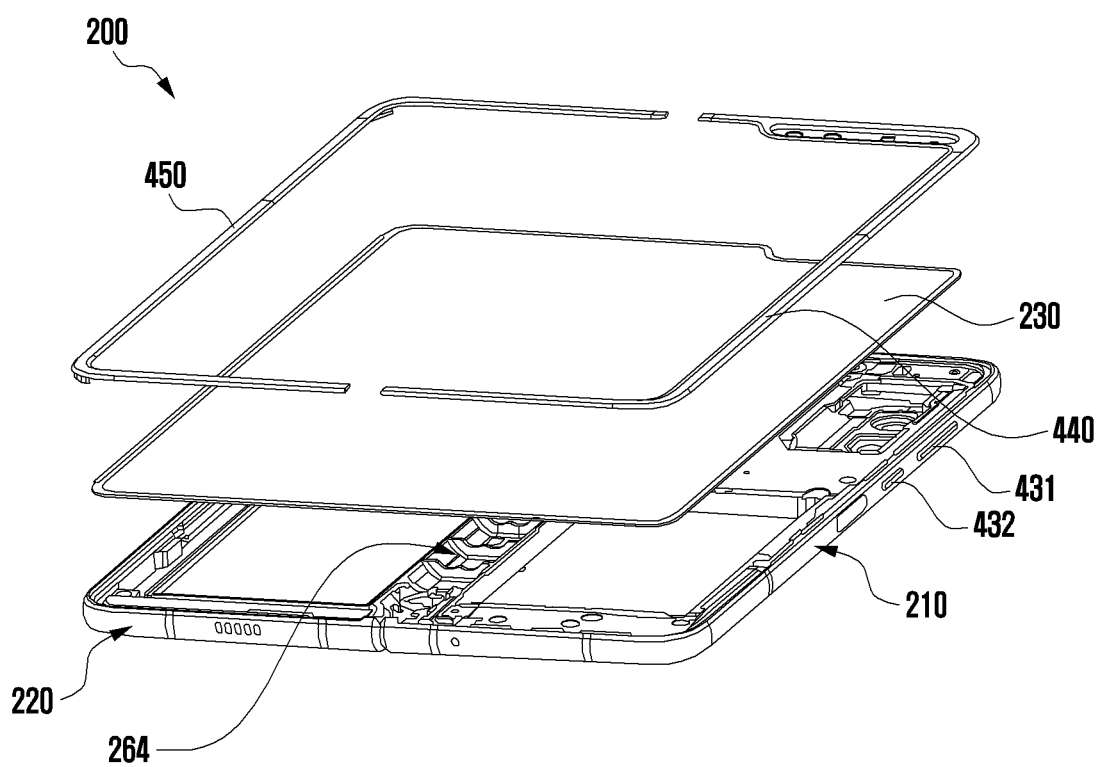
FIG. 4 is an exploded perspective view illustrating the example electronic device including protective members according to various embodiments.

FIG. 4 is an exploded perspective view illustrating the electronic device including protective members according to various embodiments.

According to various embodiments, the electronic device 200 shown in FIG. 4 (e.g., the electronic device 101 shown in FIG. 1) may be at least partially similar to or the same as the electronic device 200 shown in FIG. 2A, 2B, or 3.

Referring to FIG. 4, an electronic device 200 according to various embodiments may include a foldable housing 210, 220 at least partially folding using a hinge structure (the hinge structure 264 shown in FIG. 3), a display 230 disposed on the foldable housing 210, 220 (e.g., the first display 230 shown in FIG. 2A), or protective members (e.g., frames) 440 and 450 disposed on at least a portion of the border of the display 230 and coupled to the foldable housing 210, 220.

The expression used herein "border" may refer, for example, to an area adjacent to an edge and having a predetermined width in a plate-shaped part. For example, the border of the display 230 may be the non-display region of the display 230. The expression "border" be used interchangeably herein with the terms "edge area", a "boundary", the "boundary of an edge", or a "rim".

According to an embodiment, the foldable housing 210, 220 may include, with respect to a hinge structure 264, a first housing structure 210 (e.g., the first housing structure 210 shown in FIG. 2A) disposed at a side of the hinge structure 264 or a second housing structure 220 (e.g., the second housing structure 220 shown in FIG. 2A) disposed at the other side of the hinge structure 264.

According to an embodiment, the display 230 may include a flexible display panel (e.g., 530 in FIG. 5) that is shown (e.g., viewable) through and at least partially in contact with the front surface of the foldable housing 210, 220, or a conductive plate (e.g., 550 in FIG. 5) on which the flexible display panel 530 is seated. The stacked structure of the display 230 will be described in greater detail below with reference to FIG. 5.

According to an embodiment, the protective members 440 and 450 (e.g., a decorative member, or frame) may include a first protective member 440 overlapping the first housing structure 210 and/or a second protective member 450 overlapping the second housing structure 220.

According to an embodiment, the first protective member 440 can cover a border of the display such that the border of the display 230 disposed on the first housing structure 210, for example, a non-display region (e.g., 702 in FIG. 7) is not shown to the outside.

According to an embodiment, the non-display region (e.g., 702 in FIG. 7) may be a BM region (black matrix region) or a non-driven region of the display 230.

According to an embodiment, the second protective member 450 can cover another border of the display such that the border of the display 230 disposed on the second housing structure 220, for example, a the non-display region 702 is not shown to the outside.

According to an embodiment, the protective members 440 and 450 may include a polymer material and/or a metal material, and may be coupled respectively to the housing structures 210 and 220 by, for example, at least one of bonding, taping, thermal bonding, or structural coupling.

Reference numerals 431 and 432 shown in FIG. 4 may indicate at least one physical key disposed on a first side surface 213a or a fourth side surface 223a.

Figure 5:
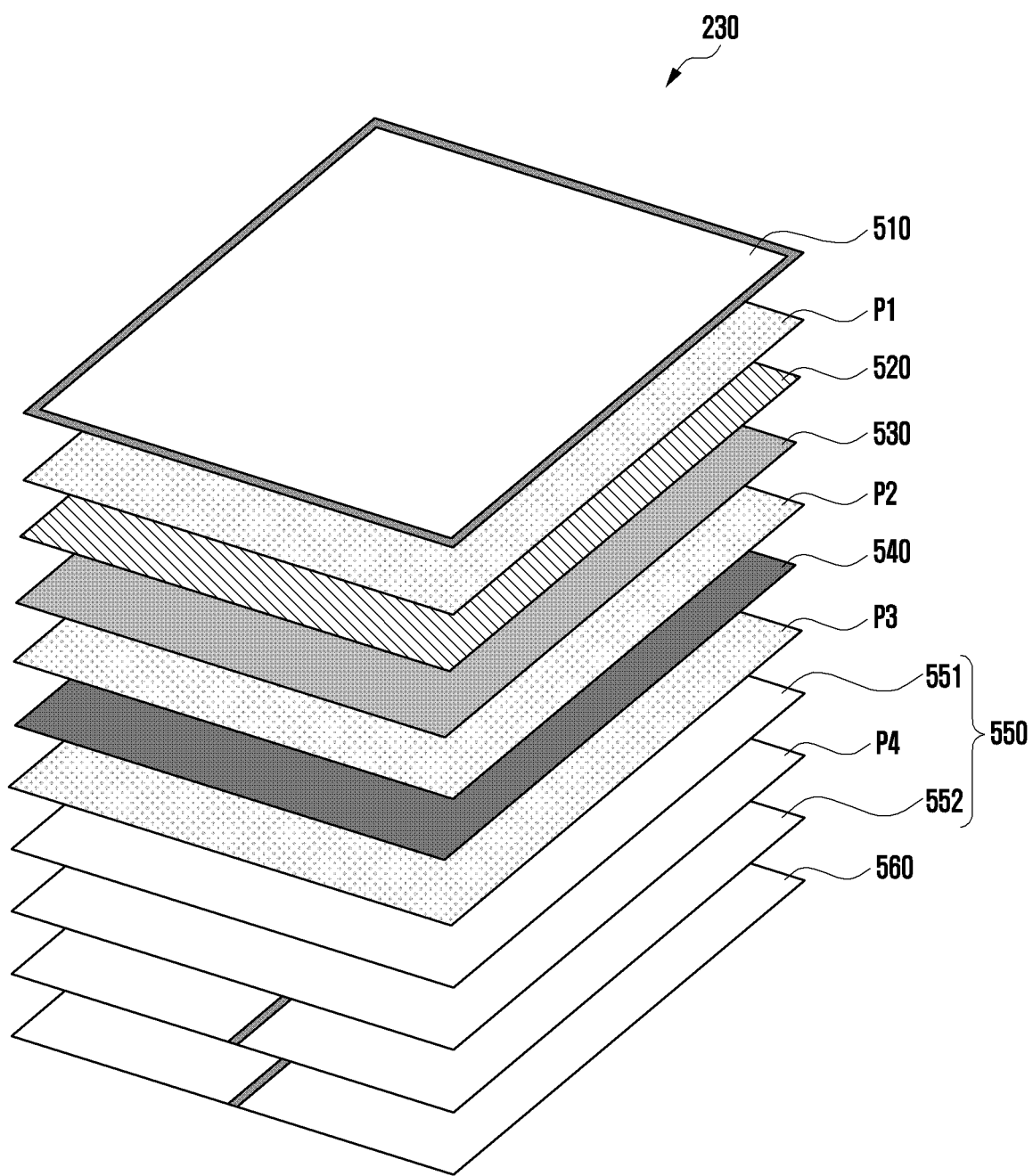
FIG. 5 is an exploded perspective view illustrating an example stacked structure of a display according to various embodiments.

FIG. 5 is an exploded perspective view illustrating an example stacked structure of a display according to various embodiments.

The display 230 shown in FIG. 5 may be at least partially similar to or the same as the display 230 shown in FIG. 2A, 2B, 3, or 4.

Referring to FIG. 5, the display 230 according to various embodiments may include a window 510 (e.g., a PI (polyimide) film), and a POL (polarizer) 520 (e.g., a polarizing film), a flexible display 530, a polymer member 540, and/or a conductive plate 550 sequentially disposed on the rear surface of the window 510.

According to an embodiment, the window 510, the POL 520, the flexible display 530, the polymer member 540, and/or the conductive plate 550 may be disposed to at least partially cover a first surface (e.g., the first surface 211 shown in FIG. 2A) of the first housing structure (e.g., the first housing structure 210 shown in FIG. 2A) and a third surface (e.g., the third surface 221 shown in FIG. 2A) of the second housing structure (e.g., the second housing structure 220 shown in FIG. 2A).

According to an embodiment, the POL 520, the flexible display 530, the polymer member 540, and the conductive plate 550 may be attached to each other through adhesive members P1, P2, and P3. For example, the adhesive members P1, P2, and P3 may include, for example, and without limitation, at least one of an optical clear adhesive (OCA), a pressure sensitive adhesive (PSA), a thermal reactant adhesive, a normal adhesive, a double-sided tape, or the like.

According to an embodiment, the display 230 may include another adhesive member P4 (e.g., a double-sided tape or a waterproof member) disposed along the edge on the rear surface of the conductive plate 550. According to an embodiment, the display 230 may be attached to a support assembly (e.g., the support assembly 260 shown in FIG. 3) of the electronic device (e.g., the electronic device 200 shown in FIG. 3) through another adhesive member.

According to various embodiments, the polymer member 540 may have a dark color (e.g., black), thereby being able to help to show the background when the display 230 is not activated. According to an embodiment, the polymer member 540 may function as a cushion for preventing and/or reducing damage to the display 230 by absorbing shock from the outside of the electronic device 200.

According to an embodiment, the conductive plate 550, which may include a metal sheet, can help increase the strength of the electronic device 200 and can be used to block surrounding noise and distribute heat discharged from surrounding heat discharge parts. According to an embodiment, the material of the conductive plate 550 may include, for example, and without limitation, at least one selected from Steel Used Stainless (SUS), Cu, CLAD (e.g., a stacked member in which SUS and Al are alternately disposed), Al, or the like. As another embodiment, the conductive plate 550 may include other alloy materials. According to an embodiment, the conductive plate 550 may include a plurality of layers 551 and 552. For example, the conductive plate 550 may include two layers, such as, a metal layer 551 and a reinforcing layer 552. According to an embodiment, the metal layer 551 may be one sheet and may include, for example, and without limitation, at least one selected from Steel Used Stainless (SUS), Cu, CLAD (e.g., a stacked member in which SUS and Al are alternately disposed), Al, or the like. According to an embodiment, the reinforcing layer 552 is disposed under the metal layer 551 and may include, for example, two reinforcing sheets separated by a hinge structure (e.g., the hinge structure 264 shown in FIG. 3). According to an embodiment, an insulating layer 560 (e.g., an insulating tape) may be further disposed under the reinforcing layer 552.

According to various embodiments, the display 230 may include at least one functional member disposed between the polymer member 540 and the conductive plate 550. According to an embodiment, the functional member may include, for example, and without limitation, a graphite sheet for heat dissipation, an added display, a force touch FPCB, a fingerprint sensor FPCB, a communication antenna emitter, a heat dissipation sheet, a conductive/nonconductive tape, an open cell sponge, or the like. According to an embodiment, when the functional member can be bent, it may be disposed from the first housing structure (e.g., the first housing structure 210 shown in FIG. 3) to at least a portion of the second housing structure (e.g., the second housing structure 220 shown in FIG. 3) through a hinge structure (e.g., the hinge structure 264 shown in FIG. 3). As another embodiment, the display 230 may further include a detection member for detecting input by an electromagnetic induction type writer. According to an embodiment, the detection member may include a digitizer.

Figure 7:
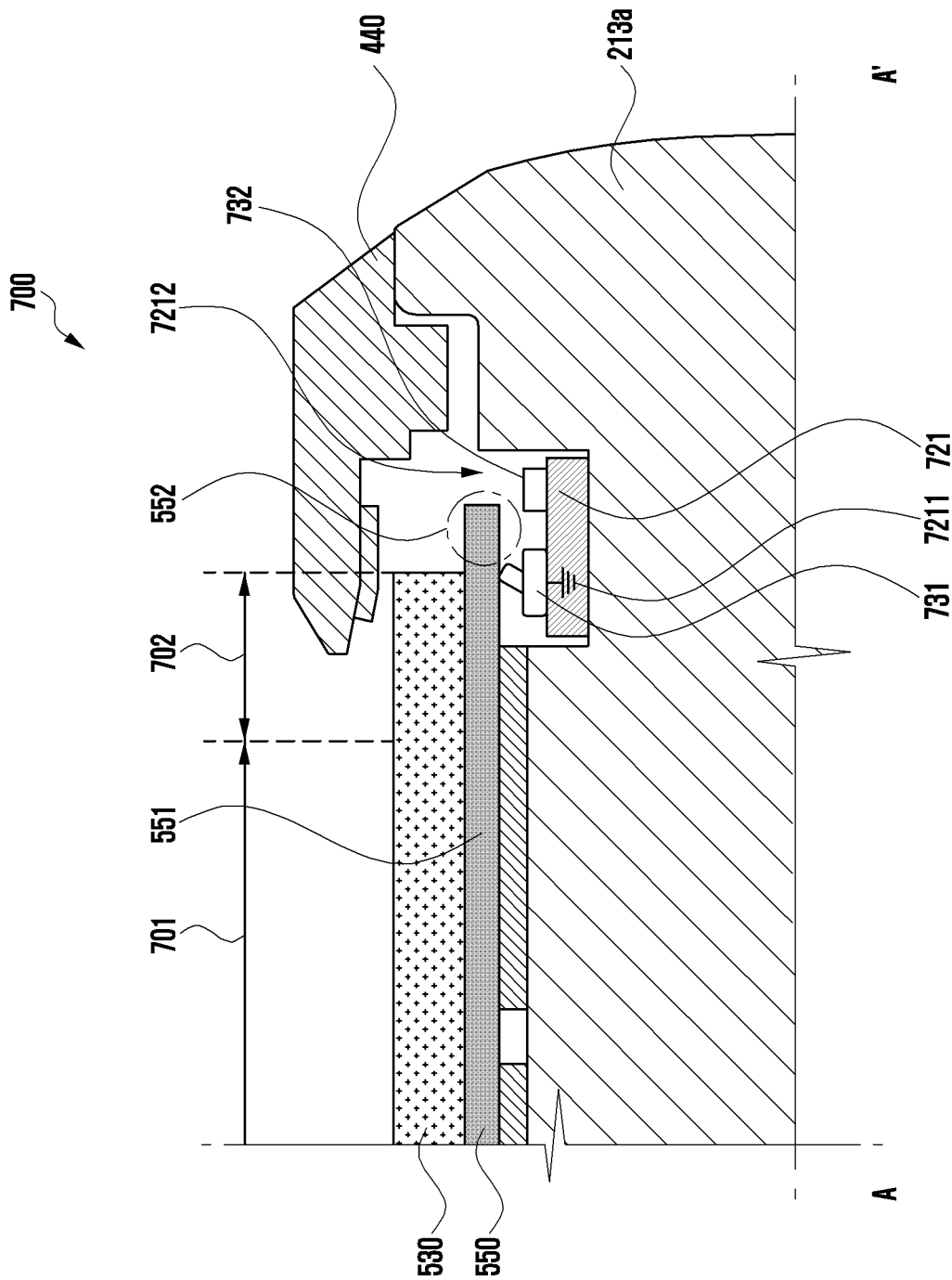
FIG. 7 is a cross-sectional view of a portion of the electronic device according to various embodiments.

An electronic device (e.g., 101 in FIG. 1) according to various example embodiments may include: a foldable housing (e.g., 210 and 220 in FIG. 2A) at least partially foldable via a hinge; a display including a flexible display panel (e.g., 530 in FIG. 5) viewable through the front surface of the foldable housing and configured to at least partially fold, and a conductive plate (e.g., 550 in FIG. 5) disposed on the rear surface of the flexible display panel and supporting the flexible display panel; a circuit board (e.g., 721 in FIG. 7)

disposed to face at least a portion of a border of the conductive plate in the foldable housing; and at least one conductive connection member comprising a conductor (e.g., 721 in FIG. 1) disposed between the conductive plate and the circuit board and electrically connecting the conductive plate and a ground of the circuit board. The conductive connection member may be in contact with at least a portion of the conductive plate in a non-display region of the flexible display panel. The conductive plate has a first portion overlapping the flexible display panel and a second portion extending from the first portion to the edge of the flexible display panel without overlapping the flexible display panel, and the conductive connection member may be in contact with at least a portion of the second portion. The conductive plate may have a third portion overlapping a display region of the flexible display panel and a fourth portion overlapping the non-display region of the flexible display panel, and the conductive member may be in contact with at least a portion of the fourth portion. The foldable housing may include a side bezel casing or at least partially covering the side surfaces of the electronic device 101, the side bezel may have a first conductive section having a dividing portion and configured to function as an antenna and a second conductive section other than the first conductive section, and the circuit board may be disposed in at least a portion of the second conductive section. The side bezel includes a first side bezel and a second side bezel disposed respectively at both sides of the hinge with a folding axis of the hinge disposed therebetween. The first side bezel has a first side surface disposed in parallel with the folding axis, a second side surface extending perpendicular to the folding axis from an end of the first side surface, and a third side surface extending perpendicular to the folding axis from another end of the first side surface. The second side bezel has a fourth side surface disposed in parallel with the folding axis, a fifth side surface extending perpendicular to the folding axis from an end of fourth side surface, and a sixth side surface extending perpendicular to the folding axis from another end of the fourth side surface. The circuit board may be disposed on the first side surface or the fourth side surface. The first side surface or the fourth side surface of the side bezel may include a groove in which the circuit board is seated. A varistor that may provide an anti-electric shock function may be installed on the circuit board. The grounding portion where the conductive connection member and the ground of the circuit board are grounded may be provided at several positions on the circuit board. The several grounding portions may be arranged with predetermined gaps in a longitudinal direction in which the circuit board is disposed. The material of the conductive plate may include at least any one of steel used stainless (SUS), Cu, or Al.

An electronic device according to various example embodiments may include: a housing having a side bezel at least partially surrounding an edge of the electronic device; a display including a flexible display panel and a conductive plate disposed on the rear surface of the flexible display panel and supporting the flexible display panel; a circuit board disposed to face at least a portion of a border of the conductive plate inside the side bezel and including a ground; and at least one connective connection member comprising a conductor disposed between the conductive plate and the circuit board and electrically connecting the conductive plate and the ground of the circuit board.

Figure 6:
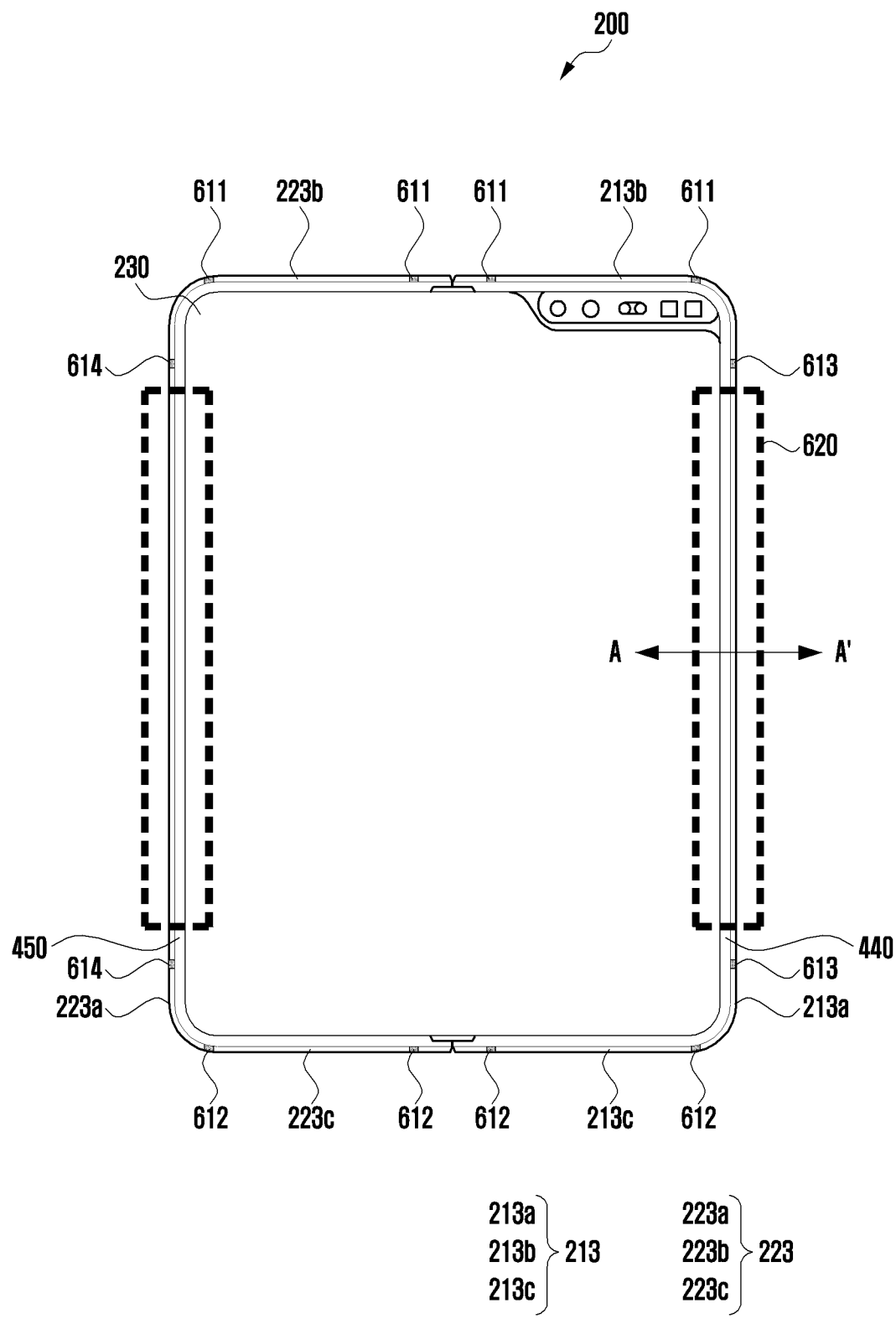
FIG. 6 is a diagram illustrating a front surface of the electronic device according to various embodiments.

FIG. 6 is a diagram illustrating an example front surface of the electronic device 200 according to various embodiments. FIG. 7 is a cross-sectional view illustrating a portion 700 of the electronic device 200 according to various embodiments. According to various embodiments, FIG. 7 may be a cross-sectional view taken along line A-A' of FIG. 6.

According to various embodiments, the electronic device 200 shown in FIG. 6 (e.g., the electronic device 101 shown in FIG. 1) may be at least partially similar to or the same as the electronic device 200 shown in FIG. 2A, 2B, or 3.

Referring to FIG. 6, the electronic device 200 according to various embodiments may include side members (e.g., side bezels) 213 and 223 casing (e.g., at least partially covering) the side surfaces of the electronic device 200. The side members 213 and 223 may include a first side member 213 (e.g., the first side member 213 shown in FIG. 2A) or a second side member 223 (e.g., the second side member 223 shown in FIG. 2A). According to an embodiment, the side members 213 and 223 shown in FIG. 6 may be a portion of the first housing structure 210 or the second housing structure 220 shown in FIG. 2A.

In an embodiment, the first side member 213 may have a first side surface 213a disposed in parallel with a folding axis (e.g., the axis A shown in FIG. 2A), a second side surface 213b extending perpendicular to the folding axis (e.g., the axis A shown in FIG. 2A) from an end of the first side surface 213a, and a third side surface 213c extending perpendicular to the folding axis (e.g., the axis A shown in FIG. 2A) from another end of the first side surface 213a.

In an embodiment, the second side member 223 may have a fourth side surface 223a disposed in parallel with a folding axis (e.g., the axis A shown in FIG. 2A), a fifth side surface 223b extending perpendicular to the folding axis (e.g., the axis A shown in FIG. 2A) from an end of the fourth side surface 223a, and a sixth side surface 223c extending perpendicular to the folding axis (e.g., the axis A shown in FIG. 2A) from another end of the fourth side surface 223a.

According to an embodiment, the electronic device 200 may include a first protective member or frame (e.g., 440 in FIG. 4) disposed on the first side member 213 and coupled to the first side member 213 or a second protective member (e.g., 450 in FIG. 4) disposed on the second side member 223 and coupled to the second side member 223. According to an embodiment, the first side member 213 and the first protective member (e.g., 440 in FIG. 4) may be integrated, and the second side member 223 and the second protective member (e.g., 450 in FIG. 4) may be integrated.

In an embodiment, the side members 213 and 223 have a first conductive section having dividing portions 611, 612, 613, and 614 (e.g., non-display portions) and functioning as an antenna, and a second conductive section excepting the first conductive section.

According to various embodiments, a portion of the first side surface 213a, and the second side surface 213b and the third side surface 213c of the first side member 213 may be the first conductive section functioning as an antenna, and a portion of the fourth side surface 223a, and the fifth side surface 223b and the sixth side surface 223c of the second side member 223 may be the first conductive section functioning as an antenna. According to various embodiments, the first side surface 213a of the first side member 213 and the fourth side surface 223a of the second side member 223 may have the second conductive section 620 not functioning as an antenna. For example, in the shown example, the areas 620 indicated by dotted lines may be the second conductive sections that do not function as an antenna in the side members 213 and 223. According to an embodiment, the first side surface 213a may have two dividing portions 613 spaced apart from each other, and the second conductive section 620 that does not function as an antenna may be positioned between the two spaced dividing portions 613. According to an embodiment, the fourth side surface 223a may have two dividing portions 614 spaced apart from each other, and the second conductive section 620 that does not function as an antenna may be positioned between the two spaced dividing portions 614.

The electronic device 200 according to various embodiments may have a ground connection structure in which the conductive plate 550 of the display 230 is electrically connected with the ground (e.g., 711 in FIG. 7) of the FPCB (e.g., 721 in FIG. 7) in the second conductive section 620. Hereafter, the ground connection structure is described in greater detail below with reference to FIG. 7.

Referring to FIG. 7, in the electronic device 200 according to various embodiments, a Flexible Printed Circuit Board (FPCB) is disposed to face at least a portion of the border of a conductive plate 550 in a foldable housing (e.g., 210, 220 in FIG. 2A), and at least one conductive connection member 731 (e.g., conductor such as a C-CLIP or a spring finger) disposed between the conductive plate 550 and the FPCB 721 and electrically connecting the conductive plate 550 and a ground 7211 of the FPCB 721 may be included.

According to an embodiment, the FPCB 721 may be disposed at a portion of a first side surface 213a or a portion of a fourth side surface 223a inside side members (e.g., 213 and 223 in FIG. 6). According to an embodiment, the FPCB 721 may be disposed inside the side members 213 and 223 to overlap a second conductive section (e.g., 620 in FIG. 6), which does not function as an antenna, of the side members 213 and 223. For example, the FPCB 721 may be disposed to overlap the areas 620 indicated by dotted lines in FIG. 6. According to an embodiment, the first side surface 213a or the fourth side surface 223a of the side members 213 and 223 may have a groove 7212 in which the FPCB 721 is seated. According to an embodiment, the FPCB 721 may be a key FPCB electrically connected with physical keys (e.g., 431 and 432 in FIG. 4) formed on the first side surface 213a or the fourth side surface 223a. According to another embodiment, the FPCB 721 may be separately formed from the key FPCB.

According to an embodiment, the FPCB 721 may have a ground 7211 and the ground 7211 may be electrically connected with the conductive plate 550 of the display 230 through the conductive connection member 731. The FPCB 721 may form a ground connection structure so that charges accumulated in at least a portion of the display 230 can go out through the conductive plate 550 and the conductive connection member 731.

According to an embodiment, an anti-electric shock element 732 (e.g., a varistor) may be installed on the FPCB 721. According to an embodiment, at least one of an element (not shown), a capacitor (not shown), or an inductance (not shown) that can be grounded in accordance with a resonance characteristic may be further installed on the FPCB 721.

According to various embodiments, the conductive connection member 731 may be in contact with at least a portion of the conductive plate 550 in a non-display region 702 of the flexible display panel 530. According to an embodiment, the conductive plate 550 may have a first portion 551 overlapping the flexible display panel 530, and a second portion 552 extending from the first portion 551 to the edge of the flexible display panel 530 without overlapping the flexible display panel 530. For example, the flexible display panel 530 may have a display region 701 and a non-display region 702 disposed outside the display region 701, and the conductive plate 550 may have a second portion 552 having a larger area than the flexible display panel 530 without overlapping the flexible display panel 530.

According to an embodiment, the conductive connection member 731 can electrically connect the ground 7211 of the FPCB 721 and the conductive plate 550 by coming in contact with the conductive plate 550 at at least a portion of the second portion 552.

According to an embodiment, a grounding portion where the conductive connection member 731 and the ground 7211 of the FPCB 721 are connected may be formed at several positions on the FPCB 721. According to an embodiment, the several grounding portions may be arranged with predetermined gaps in the longitudinal direction in which the FPCB 721 is disposed (e.g., the vertical direction in which the first side surface 213a or the fourth side surface 223a is formed in FIG. 6). For example, the several grounding portions may be arranged with predetermined gaps in parallel with the folding axis (e.g., the axis A shown in FIG. 2A). According to an embodiment, the grounding portion where the conductive connection member 731 and the ground 7211 of the FPCB 721 are connected is covered with a protective member (e.g., 440 and 450 in FIG. 4), for example, the first protective member 440, so it cannot be seen from the outside.

Figure 8A:
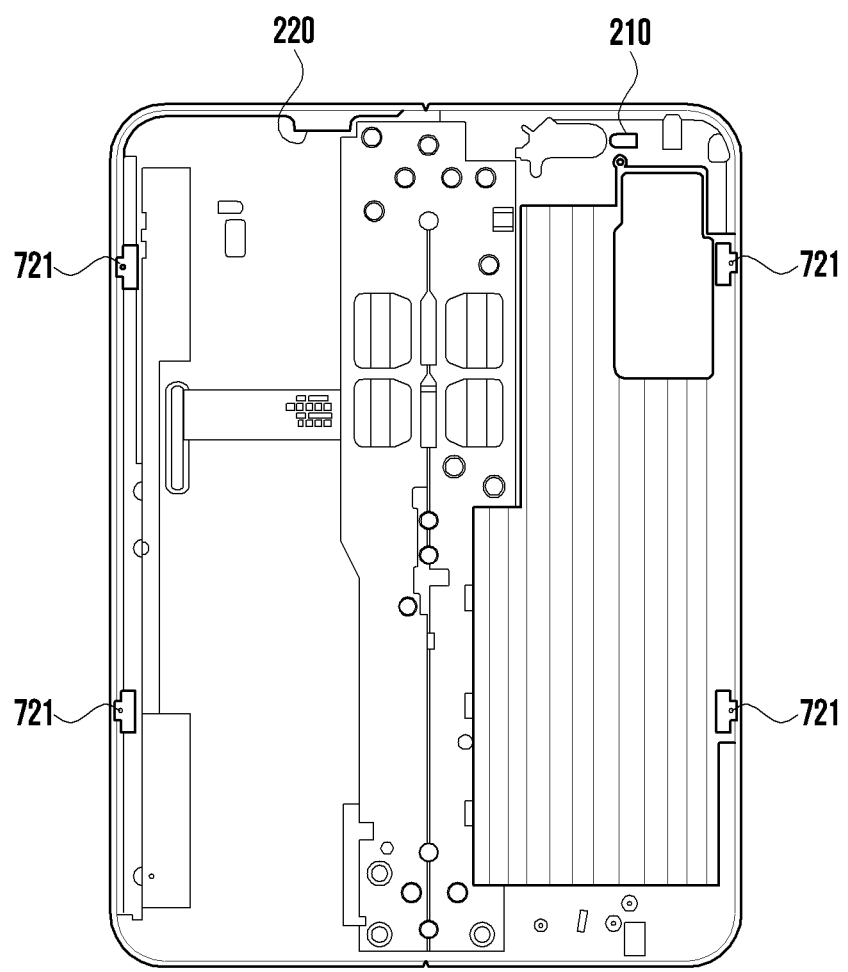
FIG. 8A is a diagram illustrating a portion where an FPCB and a conductive plate are in contact witch each other according to various embodiments.
Figure 8B:
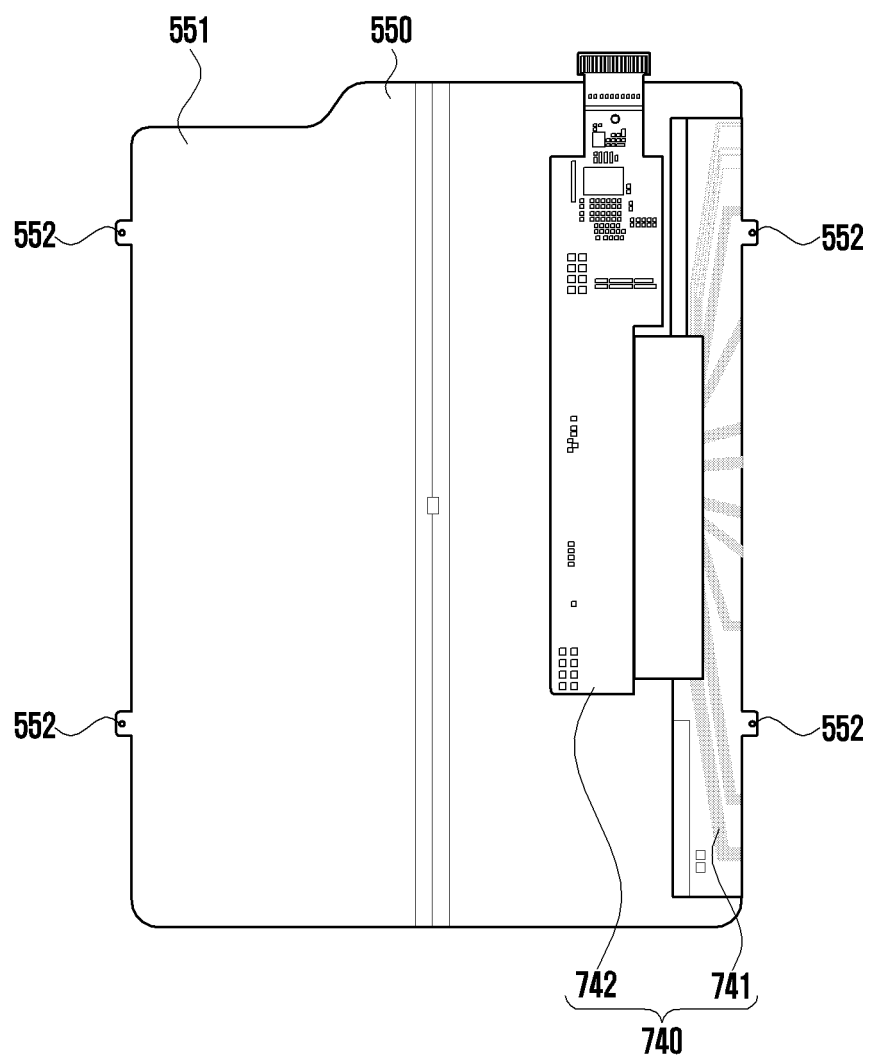
FIG. 8B is a diagram illustrating a portion where an FPCB and a conductive plate are in contact witch each other according to various embodiments.

FIG. 8A is a diagram illustrating example portions where an FPCB (e.g., 721 in FIG. 7) and a conductive plate (e.g., 550 in FIG. 7) according to an embodiment are in contact witch each other and FIG. 8B is a diagram illustrating example portions where an FPCB (e.g., 721 in FIG. 7) and a conductive plate (e.g., 550 in FIG. 7) according to an embodiment are in contact witch each other. For example, FIG. 8A may be a plan view showing the inside of a housing (e.g., 210, 220 in FIG. 2A) when an electronic device is unfolded and FIG. 8B may be a plan view showing the rear surface of a display (e.g., the first display 230 shown in FIG. 2A) such that a conductive plate (e.g., 550 in FIG. 7) is shown.

Referring to FIG. 8A, the FPCB (e.g., 721 in FIG. 7) may be disposed at the border of the housing (e.g., 210, 220 in FIG. 2A) such that a ground connection structure can be formed at the border of the housing (e.g., 210, 220 in FIG. 2A). In the shown example, the FPCB 721 is disposed in four regions, but the number of regions where the FPCB 721 is disposed may be variously changed and modified. The length of the FPCB 721 may be increased or decreased to be different from the shown example.

Referring to FIG. 8B, at least a portion of the border of the conductive plate (e.g., 550 in FIG. 7) may be disposed to face the FPCB 721 shown in FIG. 8A and may be electrically and physically in contact with the FPCB 721 through at least one conductive connection member (e.g., 731 in FIG. 7) (e.g., a conductor, such as a C-CLIP or a spring finger).

According to an embodiment, the conductive plate 550 may have a first portion 551 overlapping the flexible display panel 530, and a second portion 552 extending outward from the first portion 551. According to an embodiment, the second portion 552 may have a shape protruding outward from the first portion 551 when the conductive plate 550 is seen from above. According to another embodiment, the second portion 552 may not protrude when the conductive plate 550 is seen from above. In this case, the second portion 552 may be a border having a predetermined width of the conductive plate 550 without overlapping the flexible display panel 530.

Reference numeral 740 in FIG. 8B may be a printed circuit board on which a driving circuit for driving a display (e.g., the first display 230 shown in FIG. 2A) is installed and that is electrically connected with a portion of the display.

Reference numeral 741 in FIG. 8B may be an FPBC electrically connected with the display (e.g., the first display 230 shown in FIG. 2A).

Reference numeral '742 in FIG. 8B may be a display-driving printed circuit board on which a driving circuit for driving the display (e.g., the first display 230 shown in FIG. 2A) is installed.

According to various embodiments, the area of the conductive plate 550 may not be larger than the area of the flexible display panel 530. For example, the conductive plate 550 may not have a portion (e.g., the second portion 552 shown in FIG. 7) extending without overlapping the flexible display panel 530. In this case, the ground connection structure connecting the conductive plate 550 and the FPCB 721 may be formed at the portion overlapping the non-display region 702 of the flexible display panel 530 and is described in greater detail below with reference to FIG. 9.

Figure 9:
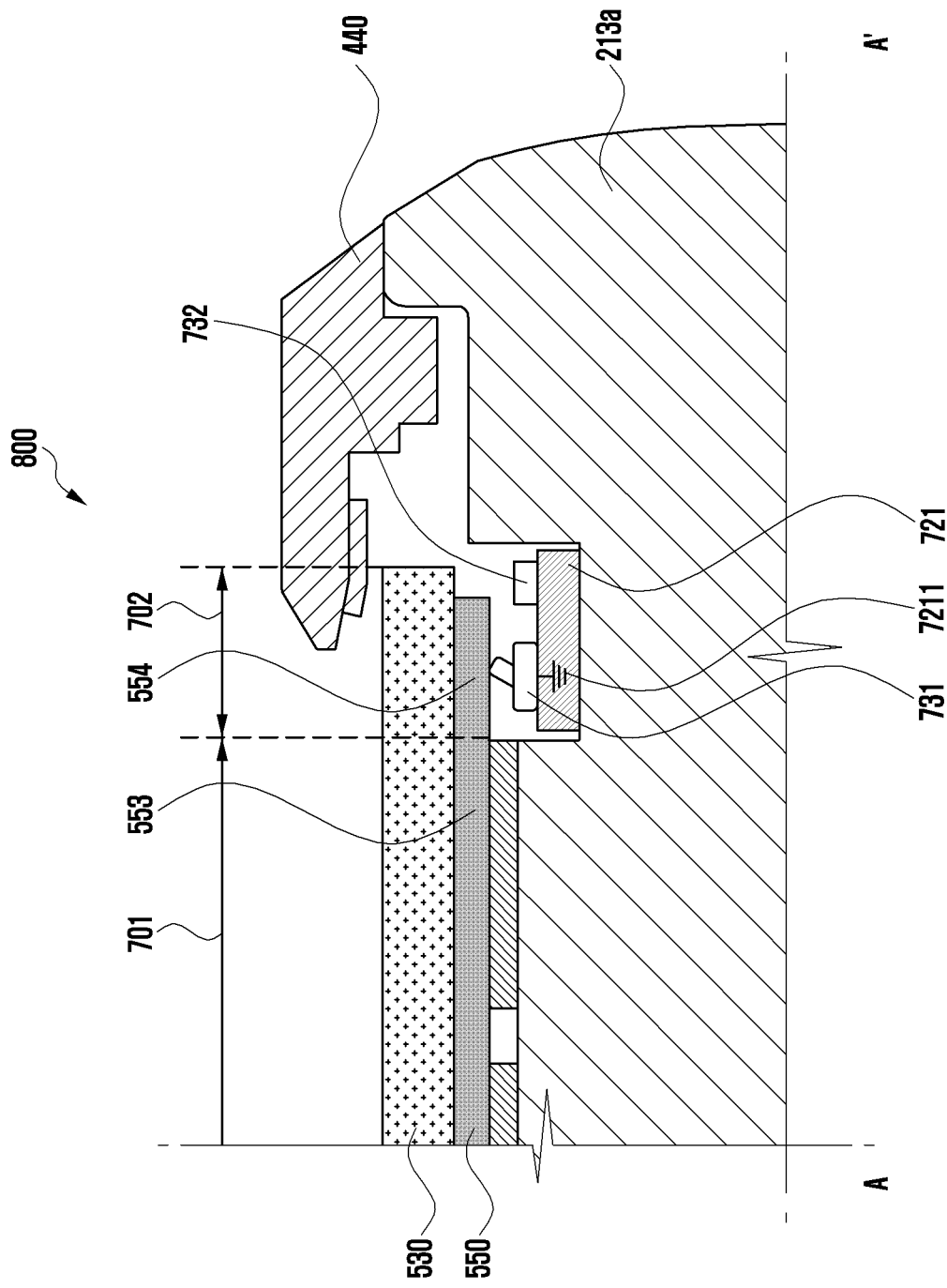
FIG. 9 is a cross-sectional view illustrating a portion of an electronic device according to another embodiment.

FIG. 9 is a cross-sectional view 800 illustrating a portion of the electronic device 200 according to another embodiment. According to various embodiments, FIG. 9 may be a cross-sectional view taken along line A-A' of FIG. 6.

According to various embodiment, the conductive plate 550 (e.g., 550 in FIG. 5) may have a third portion 553 overlapping the display region 701 of the flexible display panel 530 (e.g., 530 in FIG. 5) and a fourth portion 554 overlapping the non-display region 702 of the flexile display panel 530.

According to various embodiments, the non-display region 702 may be a BM region (black matrix region) or a non-driven region of the display panel 530.

According to various embodiments, the conductive connection member 731 can electrically connect the ground 7211 of the FPCB 721 and the conductive plate 550 by coming in contact with the conductive plate 550 at at least a portion of the fourth portion 554.

Components not described above in relation to FIG. 9 may be substantially the same as or similar to those shown in FIG. 7. Accordingly, the description related to FIG. 7 is referred to for the components not described above in relation to FIG. 9.

Figure 10:
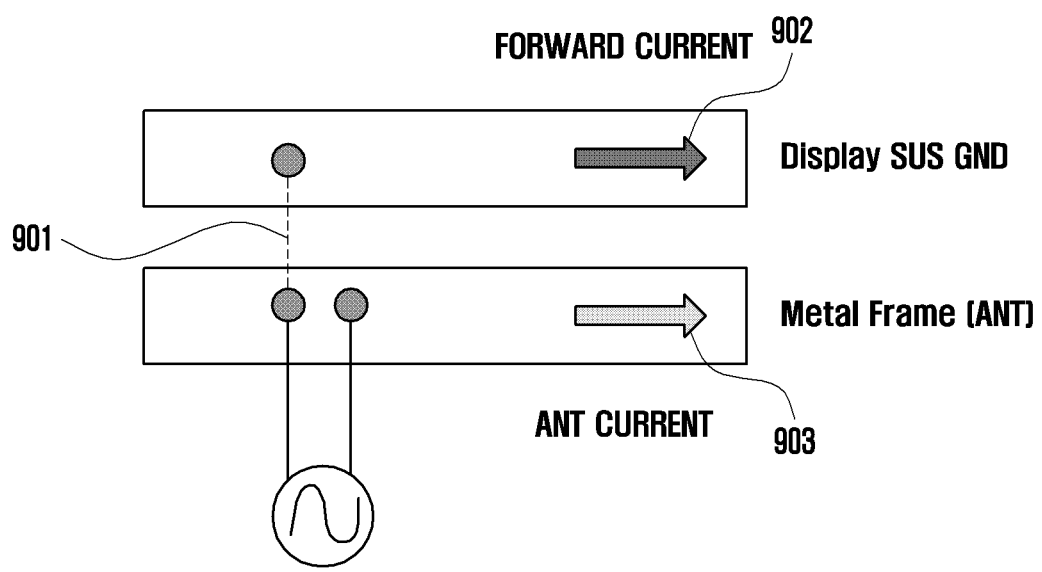
FIG. 10 is a diagram illustrating example radiation performance of the electronic device according to various embodiments.
Figure 11:
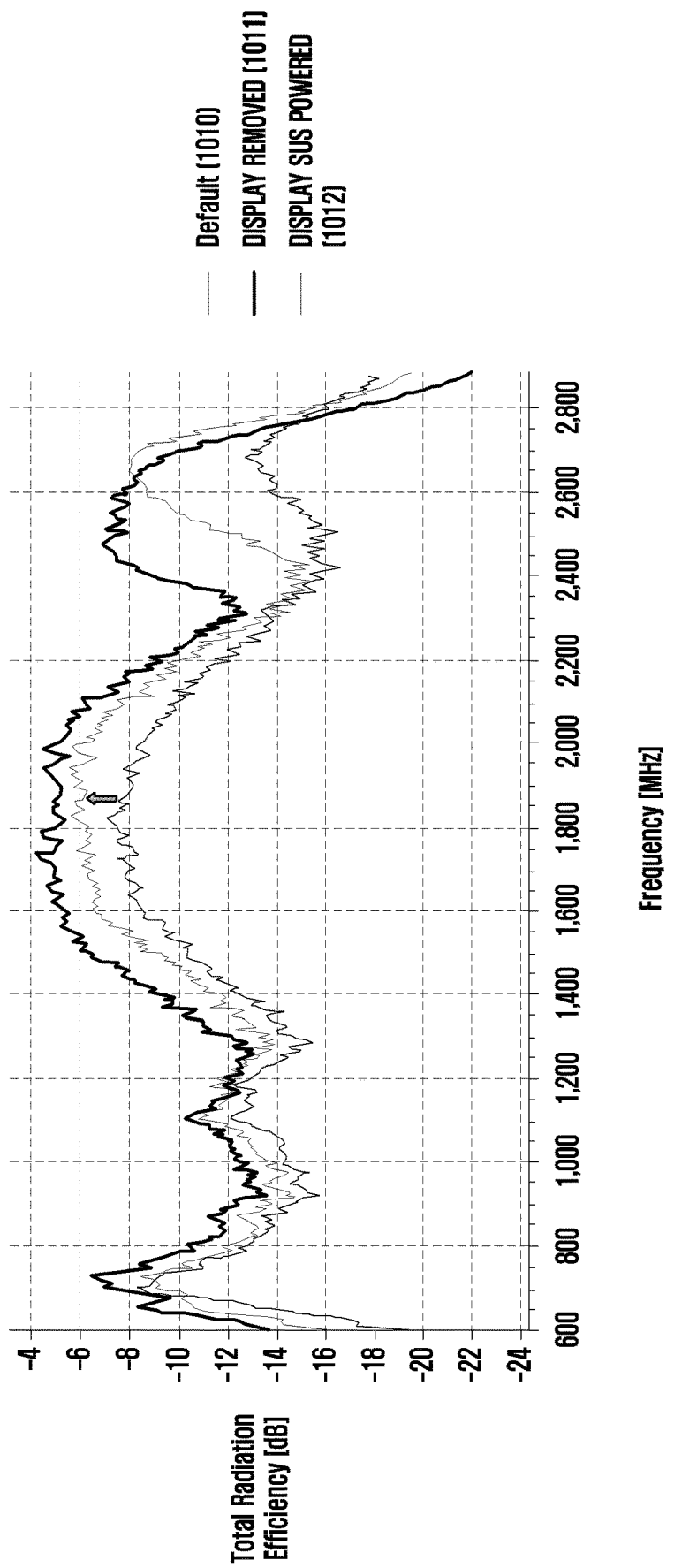
FIG. 11 is a graph illustrating a result of a test on radiation performance of the electronic device according to various embodiments.

FIG. 10 is a diagram illustrating example radiation performance of the electronic device 200 according to various embodiments. FIG. 11 is a graph illustrating an example result of a test on radiation performance of the electronic device 200 according to various embodiments;

Referring to FIG. 10, in an electronic device (e.g., the electronic device 200 shown in FIG. 2A) according to various embodiments, a housing (e.g., 210, 220 shown in FIG. 2A) has a conductive portion (e.g., the side members 213 and 223 shown in FIG. 6) and the conductive portion 213, for example, a metal frame portion may be used as an antenna. In general, when there is metal electrically floated around an antenna, a reverse current flows in the opposite direction to the current direction of the RF antenna in the floated metal, which may decrease the radiation performance of the RF antenna. In the electronic device 200 according to an embodiment, a conductive plate 550 and a side member (e.g., the first side surface 213a or the fourth side surface 223a shown in FIG. 6) of a display are electrically connected (901) at a portion (e.g., the first side surface 213a or the fourth side surface 223a shown in FIG. 6) of the side member, whereby a forward current 902 having the same direction as the current direction 903 of the antenna can flow in the conductive plate 550, and accordingly, deterioration of the radiation performance of the antenna can be prevented and/or reduced.

Referring to FIG. 11, it can be seen that a radiation performance graph 1012 when the conductive plate 550 and the side member (e.g., 213 and 223 in FIG. 2A) of the display 230 are electrically connected in accordance with various embodiments is close to the level of the radiation performance graph 1011 when a display 230 is removed because the performance increases by about 2 dB in comparison to a graph 1010 under a default condition in which the two components are not connected.

According to various embodiments, the position where a ground connection structure connecting the conductive plate 550 of the display and the FPCB 721 may be changed or modified in various ways, depending on the shape or structure of the foldable electronic device 200. For example, the foldable hosing 210, 220 is unfolded or folded in a first direction (e.g., left-right direction) when the display is seen from above in the electronic device 200 shown in FIG. 2A, 2B, or 3, but a foldable housing may be unfolded or folded in a second direction (e.g., up-down direction) perpendicular to the first direction when a display is seen from above in an electronic device according to another embodiment. Hereafter, a foldable device according to another embodiment is described in greater detail below with reference to FIGS. 12, 13 and 14.

Figure 12:
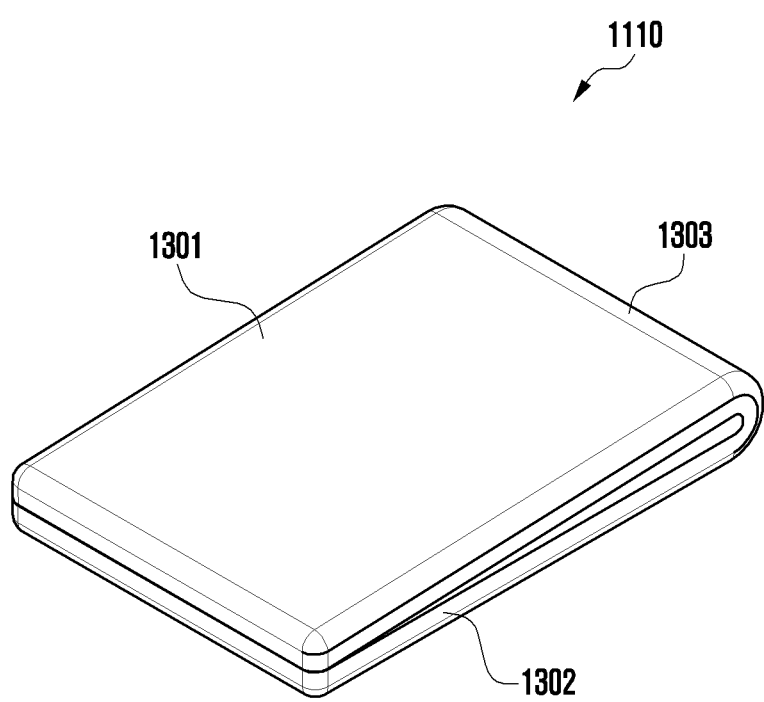
FIG. 12 is a diagram illustrating an example folded state of an electronic device according to various embodiments.
Figure 13:
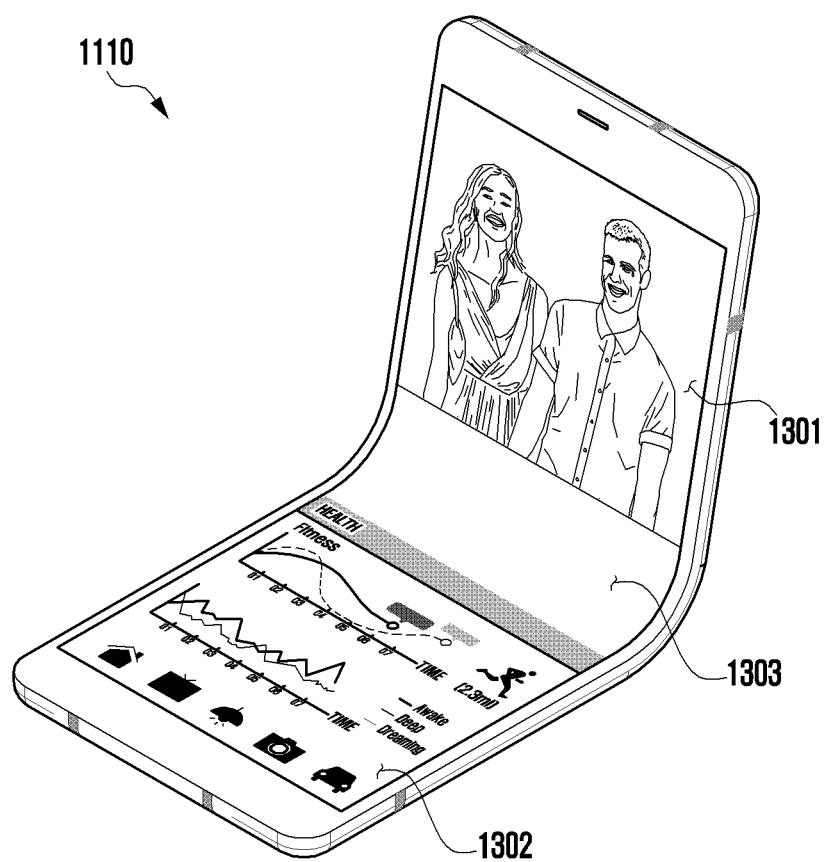
FIG. 13 is a diagram illustrating an example intermediate state of the electronic device shown in FIG. 12 according to various embodiments.
Figure 14:
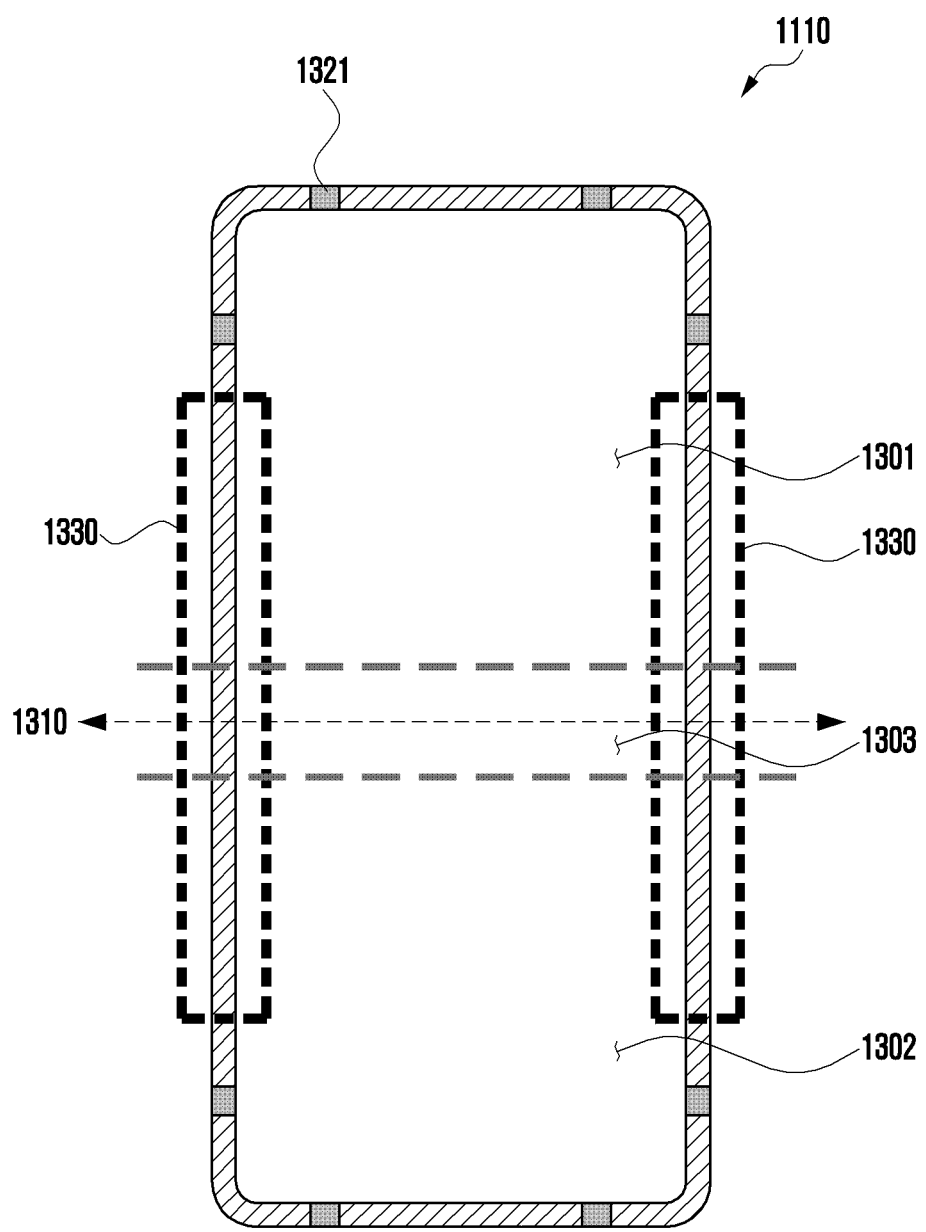
FIG. 14 is a diagram illustrating an example unfolded state of the electronic device shown in FIG. 12 according to various embodiments.

FIG. 12 is a diagram illustrating an example folded state of an electronic device according to various embodiments. FIG. 13 is a diagram illustrating an example intermediate state of the electronic device shown in FIG. 12. FIG. 14 is a diagram illustrating an example unfolded state of the electronic device shown in FIG. 12.

According to various embodiments, an electronic device 1110 shown in FIGS. 12, 13 and 14 (which may be referred to hereinafter as FIGS. 12 to 14 for simplicity) (e.g., the electronic device 101 shown in FIG. 1) may be at least partially similar to or the same as the electronic device 200 shown in FIG. 2A, 2B, or 3 except as follows.

Referring to FIGS. 12 to 14, the electronic device according to various embodiments a flexible display 1301, 1302, 1303 and the flexible display 1301, 1302, 1303 may have a folding region 1303, a first surface disposed over folding region 1303, and a second surface disposed under the folding region. According to various embodiments, a folding axis (e.g., 1310 in FIG. 14) of the electronic device 1110 may be disposed across the front surface of the flexible display 1301, 1302, 1303.

The housing of the electronic device according to various embodiments may have a dividing portion 1321 and a first conductive section functioning as an antenna on a side surface that is parallel with the folding axis 1310, and a second conducive section not functioning as an antenna on a side surface perpendicular to the folding axis 1310. For example, the areas 1330 indicated by dotted lines in FIG. 14 may be the second conductive section, and a ground connection structure that is similar to or the same as that shown in FIGS. 7 and 8 may be formed in the areas 1330 indicated by dotted lines.

According to various embodiments, the position where a ground connection structure connecting the conductive plate 550 of the display and the FPCB 721 may be changed or modified in various ways, depending on the kind of the electronic device 200. In general, the electronic device 200 having a flexible display necessarily includes a conductive plate 550 increasing strength by supporting the flexible display panel 530, and the structure in which a ground connection structure connecting the conductive plate 550 of the display and the FPCB 721 in accordance with various embodiments can be applied to various electronic devices 200 having a flexible display. For example, the structure in which a ground connection structure connecting the conductive plate 550 of the display and the FPCB 721 in accordance with various embodiments can be applied not only to the foldable electronic device 200, but also a stretchable electronic device in which the length or width of a display can be increase because a flexible display is included, or a rollable display electronic device. Accordingly, a stretchable electronic device or a rollable display electronic device may also include an FPCB (e.g., 721 in FIG. 7) disposed to face at least a portion of the border of a conductive plate (e.g., 550 in FIG. 5) of a display (e.g., 230 in FIG. 5) inside a side housing (e.g., a side member), and at least one conductive connection member (e.g., 731 in FIG. 7) disposed between the conductive plate 550 and the FPCB 721 and electrically connecting the conductive plate 550 and a ground (e.g., 7211 in FIG. 7) of the FPCB 721.

Figure 15:
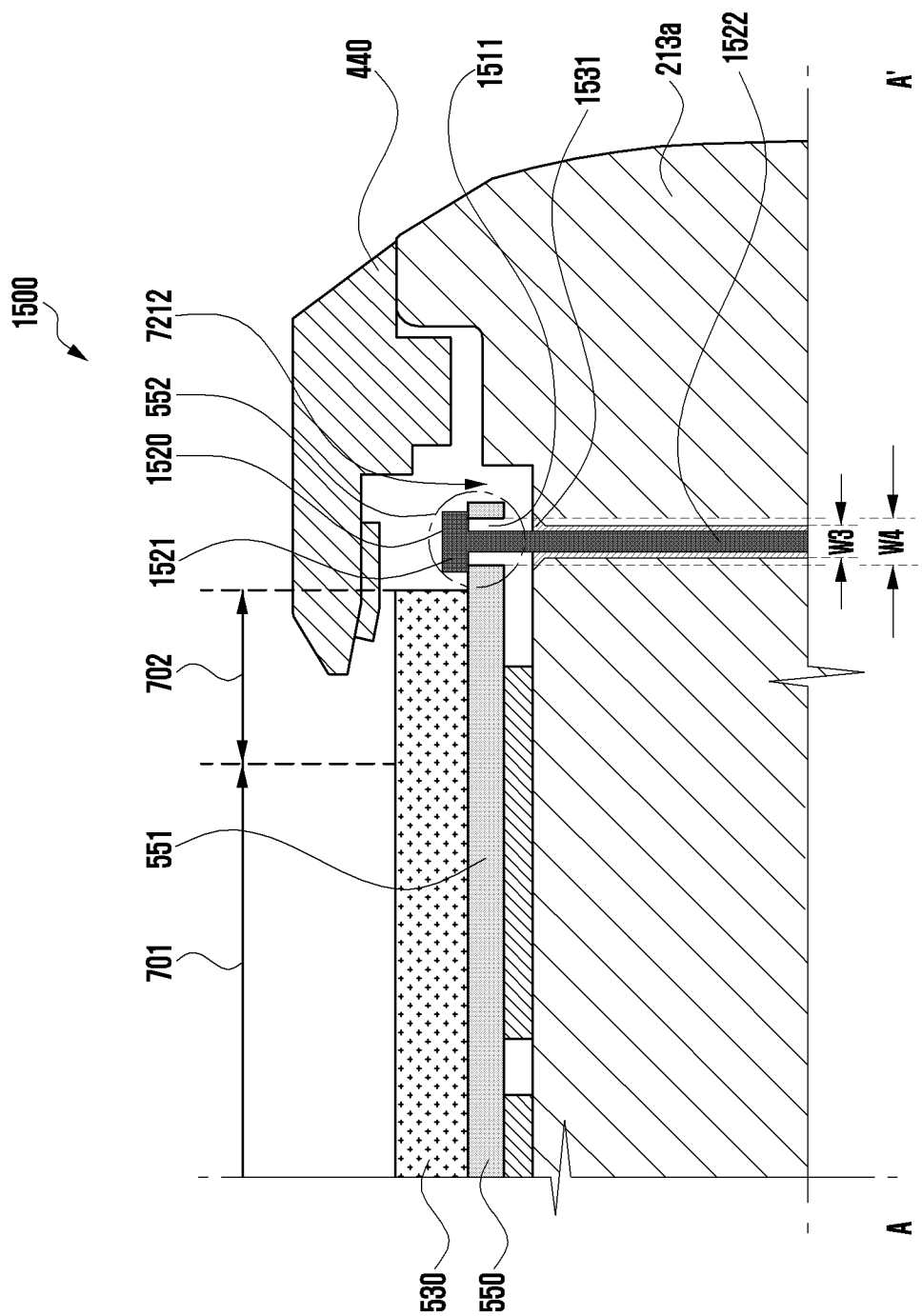
FIG. 15 is a cross-sectional view illustrating a portion of the electronic device according to various embodiments.

FIG. 15 is a cross-sectional view 1500 of a portion of the electronic device according to an embodiment. For example, FIG. 15 may be a cross-sectional view taken along line A-A' shown in FIG. 6.

According to an embodiment, an electronic device shown in FIG. 15 (e.g., the electronic device 101 shown in FIG. 1) may be at least partially similar to or the same as the electronic device shown in FIG. 7.

Referring to FIG. 15, the electronic device 101 according to an embodiment may not include an FPCB (e.g., 721 in FIG. 7) or a conductive connection member (e.g., 731 in FIG. 7). For example, as shown in FIG. 15, the electronic device 101 may have a ground connection structure, which may, for example, be provided by a screw 1520, of a flexible display panel 530. For example, the conductive plate 550 may have a first portion 551 overlapping the flexible display panel 530, and a second portion 552 extending from the first section 551 to the edge of the flexible display panel 530 without overlapping the flexible display panel 530, in which at least a portion of the second portion 552 is fastened to at least one screw 1520, thereby being able to form a ground connection structure.

According to an embodiment, the screw 1520 may be fastened to a portion of a side member (e.g., 213 and 223 in FIG. 6), for example, a portion of a first side member 213*a* through the second portion 552 of the conductive plate 550.

According to an embodiment, the screw 1520 may have a head 1521 and a stem 1522 vertically extending from the head 1521. According to an embodiment, the head 1521 may be physically brought in contact with the top of the conductive plate 550 by the stem 1552 passing through the second portion 552 of the conductive plate 550.

According to an embodiment, the second portion 552 of the conductive plate 550 may have at least one hole 1511 through which the screw 1520 passes. According to an embodiment, the stem 1522 of the screw 1520 may have a third width w3 and the hole 1511 formed in the conductive plate 550 may have a fourth width w4. According to an embodiment, the fourth width w4 may be larger than the third width w3. According to the electronic device 101, it is possible to form a margin in which the flexible display panel 530 or the conductive plate 550 of the display (e.g., 230 in FIG. 2) stretches (or contracts) when the foldable housing (e.g., 210, 220 in FIG. 2A) is folded or unfolded by making the size (e.g., the fourth width w4) of the hole 1511 of the conductive plate 550 larger than the size (e.g., the third width w3) of the stem 1522 of the screw 1520. For example, when the foldable housing 210, 220 is unfolded from the folded state or vice versa, at least a portion (e.g., bezel) of the border of the display 230 that is covered by the protective members 440 and 450 can be stretched (or contracted) by tension. According to the electronic device 101, it is possible to form a ground connection structure and secure a margin consideration stretch (of contract) of the display 230 by designing the hole 1511 of the conductive plate 550 as described above.

According to an embodiment, a portion of the side member (e.g., 213 and 223 in FIG. 6), for example, the first side surface 213*a* may have a groove 1531 in which the stem 1522 of the screw 1520 is inserted. The inner surface of the groove 1531 may be made of a non-conductive material unlike the side member (e.g., 213 and 223 in FIG. 6). According to the electronic device 101, since the inner surface of the groove 1531 in which the screw 1520 is inserted is made of a non-conductive material, it is possible to prevent and/or reduce the risk of a user who touches or access the side member (e.g., 213 and 223 in FIG. 6) from getting shocked.

In an electronic device according to various example embodiments, it is possible to prevent and/or reduce (e.g., greenish or reddish) burn-in of a display and to block and/or reduce noise by grounding a conductive plate and a ground through at least a portion of the edge of a flexible display.

In an electronic device according to various example embodiments, it is possible to prevent and/or reduce surface quality deterioration in which a surface of a flexible display protrudes due to the grounding structure of a ground by grounding a conductive plate and a ground through at least a portion of the edge of a flexible display.

The electronic device according to various embodiments may be one of various types of electronic devices. The electronic devices may include, for example, and without limitation, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor(e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code made by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by one of ordinary skill in the art that various changes in form and detail may be made without departing from the true spirit and full scope of the disclosure, including the appended claims and their equivalents.

What is claimed is:

1. An electronic device comprising:
   a foldable housing at least partially foldable via a hinge;
   a display including a flexible display panel viewable through a front surface of the foldable housing and being at least partially foldable, and a conductive plate disposed on a rear surface of the flexible display panel and supporting the flexible display panel;
   a circuit board disposed to face at least a portion of a border of the conductive plate in the foldable housing; and
   at least one conductive connection member, comprising a conductor, disposed between the conductive plate and the circuit board and electrically connecting the conductive plate and a ground of the circuit board,
   wherein the conductive plate includes a first portion overlapping the flexible display panel and a second portion extending from the first portion to an edge of the flexible display panel without overlapping the flexible display panel, and the conductive connection member contacts at least a portion of the second portion.

2. The electronic device of claim 1, wherein the conductive connection member contacts at least a portion of the conductive plate in a non-display region of the flexible display panel.

3. The electronic device of claim 1, wherein the foldable housing includes a side bezel at least partially covering side surfaces of the electronic device, the side bezel including a first conductive section having a non-conductive portion and configured to function as an antenna and a second conductive section other than the first conductive section, and the circuit board is disposed in at least a portion of the second conductive section.

4. The electronic device of claim 3, wherein the side bezel includes a first side portion and a second side portion disposed respectively at both sides of the hinge with a folding axis of the hinge therebetween,
   wherein the first side portion has a first side surface disposed in parallel with the folding axis, a second side surface extending perpendicular to the folding axis from an end of the first side surface, and a third side surface extending perpendicular to the folding axis from another end of the first side surface,
   wherein the second side portion has a fourth side surface disposed in parallel with the folding axis, a fifth side surface extending perpendicular to the folding axis from an end of fourth side surface, and a sixth side surface extending perpendicular to the folding axis from another end of the fourth side surface, and
   wherein the circuit board is disposed on the first side surface or the fourth side surface.

5. The electronic device of claim 4, wherein the first side surface or the fourth side surface of the side bezel includes a groove in which the circuit board is seated.

6. The electronic device of claim 1, wherein a varistor configured to provide anti-electric shock is disposed on the circuit board.

7. The electronic device of claim 1, wherein a grounding portion where the conductive connection member and the ground of the circuit board are connected is provided at several positions on the circuit board.

8. The electronic device of claim 7, wherein the grounding portions are arranged with predetermined gaps in a longitudinal direction in which the circuit board is disposed.

9. The electronic device of claim 7, wherein several grounding portions where the conductive connection member and the ground of the circuit board are connected are arranged with predetermined gaps in a longitudinal direction in which the circuit board is disposed.

10. The electronic device of claim 1, wherein a material of the conductive plate includes at least any one of steel used stainless (SUS), Cu, or Al.

11. An electronic device comprising:
a foldable housing at least partially foldable via a hinge;
a display including a flexible display panel viewable through a front surface of the foldable housing and being at least partially foldable, and a conductive plate disposed on a rear surface of the flexible display panel and supporting the flexible display panel;
a circuit board disposed to face at least a portion of a border of the conductive plate in the foldable housing; and
at least one conductive connection member, comprising a conductor, disposed between the conductive plate and the circuit board and electrically connecting the conductive plate and a ground of the circuit board,
wherein the conductive plate includes a third portion overlapping a display region of the flexible display panel and a fourth portion overlapping a non-display region of the flexible display panel, and
the conductive connection member contacts at least a portion of the fourth portion.

12. The electronic device of claim 11, wherein the foldable housing includes a side bezel at least partially covering side surfaces of the electronic device, the side bezel including a first conductive section having a non-conductive portion and configured to function as an antenna and a second conductive section other than the first conductive section, and the circuit board is disposed in at least a portion of the second conductive section.

13. The electronic device of claim 12, wherein the side bezel includes a first side portion and a second side portion disposed respectively at both sides of the hinge with a folding axis of the hinge therebetween,
wherein the first side portion has a first side surface disposed in parallel with the folding axis, a second side surface extending perpendicular to the folding axis from an end of the first side surface, and a third side surface extending perpendicular to the folding axis from another end of the first side surface,
wherein the second side portion has a fourth side surface disposed in parallel with the folding axis, a fifth side surface extending perpendicular to the folding axis from an end of fourth side surface, and a sixth side surface extending perpendicular to the folding axis from another end of the fourth side surface, and
wherein the circuit board is disposed on the first side surface or the fourth side surface.

14. An electronic device comprising:
a housing having a side bezel at least partially surrounding an edge of the electronic device;
a display including a flexible display panel and a conductive plate disposed on a rear surface of the flexible display panel, the conductive plate supporting the flexible display panel;
a circuit board disposed to face at least a portion of a border of the conductive plate inside the side bezel and including a ground; and
at least one connective connection member, comprising a conductor, disposed between at least the conductive plate and the circuit board and electrically connecting the conductive plate and the ground of the circuit board,
wherein the conductive plate includes a first portion overlapping the flexible display panel and a second portion extending from the first portion to an edge of the flexible display panel without overlapping the flexible display panel, and the conductive connection member contacts at least a portion of the second portion.

15. The electronic device of claim 14, wherein the conductive connection member contacts at least a portion of the conductive plate in a non-display region of the flexible display panel.

16. The electronic device of claim 14, wherein the side bezel includes a first conductive section having a non-conductive portion and configured to function as an antenna and a second conductive section other than the first conductive section, and the circuit board is disposed in at least a portion of the second conductive section.

17. The electronic device of claim 14, wherein the side bezel includes a groove in which the circuit board is seated.

18. The electronic device of claim 14, wherein a varistor configured to provide anti-electric shock is provided on the circuit board.

19. The electronic device of claim 14, wherein a material of the conductive plate includes at least one selected from steel used stainless (SUS), Cu, or Al.

20. An electronic device comprising:
a housing having a side bezel at least partially surrounding an edge of the electronic device;
a display including a flexible display panel and a conductive plate disposed on a rear surface of the flexible display panel, the conductive plate supporting the flexible display panel;
a circuit board disposed to face at least a portion of a border of the conductive plate inside the side bezel and including a ground; and
at least one connective connection member comprising a conductor disposed between the conductive plate and the circuit board and electrically connecting the conductive plate and the ground of the circuit board,
wherein the conductive plate includes a third portion overlapping a display region of the flexible display panel and a fourth portion overlapping a non-display region of the flexible display panel, and
the conductive connection member contacting at least a portion of the fourth portion.

* * * * *